(12) United States Patent
Kurosawa et al.

(10) Patent No.: US 7,176,671 B2
(45) Date of Patent: Feb. 13, 2007

(54) CURRENT MEASURING DEVICE

(75) Inventors: Kiyoshi Kurosawa, Tokyo (JP); Yoshiharu Hiroki, Tokyo (JP); Yoshihiro Konno, Tokyo (JP); Masaru Sasaki, Tokyo (JP)

(73) Assignees: The Tokoyo Electric Power Company, Inc, Tokyo (JP); Namiki Precision Jewel Co., Ltd., Tokyo (JP)

( * ) Notice: Subject to any disclaimer, the term of this patent is extended or adjusted under 35 U.S.C. 154(b) by 67 days.

(21) Appl. No.: 10/502,277

(22) PCT Filed: Feb. 28, 2003

(86) PCT No.: PCT/JP03/02344

§ 371 (c)(1),
(2), (4) Date: Jul. 23, 2004

(87) PCT Pub. No.: WO03/075018

PCT Pub. Date: Sep. 12, 2003

(65) Prior Publication Data
US 2005/0083033 A1    Apr. 21, 2005

(30) Foreign Application Priority Data
Mar. 1, 2002 (JP) .............................. 2002-055231

(51) Int. Cl.
G01R 31/00 (2006.01)
G01J 4/00 (2006.01)

(52) U.S. Cl. ..................................... 324/96; 324/158.1

(58) Field of Classification Search ..................... None
See application file for complete search history.

(56) References Cited

U.S. PATENT DOCUMENTS

| 4,554,449 | A | * | 11/1985 | Taniuchi et al. | ........ 250/227.23 |
| 5,272,433 | A | * | 12/1993 | Simonelli | ..................... 324/96 |
| 6,362,615 | B1 | * | 3/2002 | Davidson et al. | ............. 324/96 |

FOREIGN PATENT DOCUMENTS

| JP | 07-159450 | 6/1995 |
| JP | 07-270505 | 10/1995 |
| JP | 08-201440 | 8/1996 |
| JP | 10-319051 | 12/1998 |

* cited by examiner

Primary Examiner—Paresh Patel
(74) Attorney, Agent, or Firm—Harness, Dickey & Pierce, P.L.C.

(57) ABSTRACT

A current measuring apparatus comprises a current detection unit 10 and a photoelectric converter 20. The current detection unit 10 comprises an optical fiber sensor 11 extended or looped around a conductor 30. A reflective film 12 is attached to one end of the sensor 11 so that light can be reflected by the end of the sensor. The current detection unit 10 further comprises a first Faraday element 13, a light-transmitting birefringent member 14, a first optical fiber 15, a second optical fiber 16 and a lens 17. The Faraday element 13 rotates a plane of polarization of the incident light through about 22.5°. The birefringent member 14 functions to separate the light emitted from the sensor 11 into an ordinary ray $L_1$ and an extraordinary ray $L_2$ that are orthogonal to each other, and to transmit linearly polarized light $L_0$ emitted from a light source. The lens 17 is provided between the element 13 and the birefringent member 14. Focal points of the lens are formed at core portions of an input end 11a of the sensor 11 and an end face 15a of the first optical fiber 15. With this arrangement, the number of components is reduced and the apparatus is reduced in size.

26 Claims, 13 Drawing Sheets

CURRENT MEASURING DEVICE

CROSS-REFERENCE TO RELATED APPLICATIONS

This application is the national phase under 35 U.S.C. § 371 of PCT International Application No. PCT/JP03/02344 which has an International filing date of Feb. 28, 2003, which designated the United States of America and which claims priority on Japanese Patent Application number JP 55231/2002 filed Mar. 1, 2002, the entire contents of which are hereby incorporated herein by reference.

TECHNICAL FIELD

The present invention relates to a current measuring apparatus using the Faraday effect. Specifically, the present invention relates to a current measuring apparatus using a reflection type or a transmission type optical fiber sensor.

TECHNICAL BACKGROUND

There is known a current measuring apparatus using the Faraday effect by which a plane of polarization of light rotates due to the action of a magnetic field. As examples of current measuring apparatuses of this type, reflection type current measuring apparatuses are disclosed in Japanese Patent Application Public Disclosure No. H10-319051 and Japanese Patent Application Public Disclosure No. 2000-292459.

This type of current measuring apparatus is advantageous in that it is not affected by electromagnetic noise, and detects only a current flowing through a portion of a conductor encircled with an optical fiber, and is not affected by a current in a portion of the conductor outside the optical fiber. Therefore, it has been proposed to use this type of current measuring apparatus for a gas-insulated switch gear, or for identifying a section of occurrence of a short circuit or ground fault, monitoring a change of electricity supply and demand due to new market participants, or achieving efficient distribution to match supply to demand.

In the reflection type current measuring apparatuses disclosed in the above-mentioned patent documents, an optical fiber sensor is extended or looped around a conductor through which a current to be measured flows. Measurement is made with respect to an angle of Faraday rotation, under a magnetic field of the current to be measured, of linearly polarized light which is emitted into one end of the optical fiber sensor and reflected at an opposite end of the optical fiber sensor.

FIG. 11 shows an essential part of a conventional reflection type current measuring apparatus. This current measuring apparatus comprises a reflection type optical fiber sensor 2 extended or looped around a conductor 1 through which a current to be measured flows.

A light-transmitting ferromagnetic Faraday element 3 capable of magnetic saturation is disposed on a side of an input end of the optical fiber sensor 2. The ferromagnetic Faraday element 3 is adapted to rotate a plane of polarization of linearly polarized light through 22.5°. A light-transmitting birefringent member 4 is disposed on a side of a forward end of the ferromagnetic Faraday element 3. The birefringent member 4 is adapted to separate the light emitted from the optical fiber sensor 2 into an ordinary ray and an extraordinary ray that are orthogonal to each other, and to guide these rays to light-receiving elements.

However, this current measuring apparatus is technically disadvantageous as explained below.

When the current measuring apparatuses of the above-mentioned patent documents are actually used for measurement, the light must be converged at a core portion of the optical fiber. Therefore, for example, as shown in FIG. 11, lenses 7 are individually disposed in an area between the optical fiber sensor 2 and the ferromagnetic Faraday element 3 and an area between the birefringent member 4 and an optical fiber 5 for introducing the linearly polarized light into the birefringent member 4, or an optical fiber 6 for guiding the extraordinary ray after the separation.

With this arrangement, however, a separation distance between the ordinary ray and the extraordinary ray emerging from the birefringent member 4 is relatively narrow, so it is extremely difficult to provide two lenses 7 between the birefringent member 4 and the optical fibers 5 and 6 in a parallel relationship.

If the separation distance is increased sufficiently to accommodate the lenses 7, since the separation distance and the thickness of the birefringent member 4 are proportional to each other, the thickness of the birefringent member 4 becomes large, so that an entire structure of the current measuring apparatus becomes large.

Further, the structure shown in FIG. 11 requires a large number of components, which complicates the structure. Aligning the lenses 7 and the optical fibers is time-consuming, and a large number of operations are required for assembly, which results in a high cost of manufacture.

In the apparatus of Japanese Patent Application Public Disclosure No. H10-319051, a plane-parallel plate made of a single-axis birefringent crystal is disposed in a current detection unit. However, the structure of this apparatus does not allow an operation for assembly such that the polarization preserving optical fiber 5 and the optical fiber 6 are fixed relative to each other to thereby form a subassembly, and connected to the lenses. Therefore, each of the optical fibers must be independently fixed. Therefore, with respect to each optical fiber, a space corresponding to the volume of a fixing member and a space for an assembly operation are required. Therefore, the distance between the polarization preserving optical fiber and the optical fiber becomes large, so the current detection unit becomes large.

As a countermeasure, an arrangement shown in FIG. 12 is considered. In this arrangement, a Rochon prism 4a is used as a birefringent member, and a single lens 9 is disposed between the Rochon prism 4a and the optical fibers 5 and 6.

Further, an arrangement can be made as shown in FIG. 13, in which a wedge-shaped prism 4b made of a single-axis birefringent crystal is used as a birefringent member and the single lens 9 is provided between the wedge-shaped prism 4b and the optical fibers 5 and 6. In either of the arrangements shown in FIGS. 12 and 13, a reduction in the number of components can be achieved.

However, in these arrangements, the respective optical paths of the ordinary ray and the extraordinary ray emerging from the Rochon prism 4a or the wedge-shaped prism 4b are not parallel. When the ordinary and extraordinary rays enter the lens 9 in this state, the ordinary ray and the extraordinary ray must be made parallel after passage through the lens 9. Therefore, the structure of the lens 9 becomes complicated and delicate adjustment is required, thus making it difficult to obtain a desired effect.

On the other hand, in Japanese Patent Application Public Disclosure No. 2000-292459, the current measuring apparatus is simplified in structure by connection of a current detection unit and a photoelectric converter through a single optical fiber. However, it is impossible to compensate for a variation in the measured value of the current due to the temperature characteristic of a 22.5° Faraday element which is disposed in the current detection unit. That is, the light is received by the photoelectric converter in a state such that an angle of rotation of the linearly polarized light in a current detection optical fiber, which is obtained by the Faraday effect, is combined with a temperature-induced change in the angle of rotation of a plane of polarization of the light in the 22.5° Faraday element. Therefore, the temperature-induced change in the angle of rotation of the plane of polarization of the light in the 22.5° Faraday element cannot be separated from the rotation produced by the Faraday effect. Thus, there is no means to provide an inexpensive current measuring apparatus which comprises a small-size current detection unit and which efficiently receives the light to be measured that is emitted from the current detection unit, while compensating for a variation in the measured value of the current due to the temperature characteristic of the 22.5° Faraday element.

Next, referring to FIG. 14, description is made with regard to a conventional transmission type current measuring apparatus. In a transmission type current measuring apparatus, an optical fiber sensor 200 is extended or looped around a conductor through which a current to be measured flows. One end of the optical fiber sensor 200 is connected to a thin type polarizer 202, and the other end of the optical fiber sensor 200 is connected to a polarized-light splitting unit 204. The polarizer 202 receives random light emitted from a light source (not shown) and transmits, to the optical fiber sensor 200, only linearly polarized light consisting of a wave oscillating in the same direction. The linearly polarized light, when passed through the optical fiber sensor 200, is subject to a magnetic field produced by the current to be measured, and a plane of polarization of the linearly polarized light is rotated through a predetermined angle that is proportional to a magnitude of the magnetic field. The linearly polarized light in this state is emitted from the other end of the optical fiber sensor 200 and enters the polarized-light splitting unit 204, in which the linearly polarized light is split into an ordinary ray and an extraordinary ray. The ordinary ray is outputted to a first optical fiber 206, and the extraordinary ray is outputted to a second optical fiber 208. The ordinary ray from the first optical fiber 206 and the extraordinary ray from the second optical fiber 208 are outputted to a photoelectric converter (not shown). In the photoelectric converter, the ordinary ray and the extraordinary ray are respectively converted into electrical values, which are in turn supplied to a signal processing circuit (not shown). Based on these electrical values, an angle of Faraday rotation is determined, and a magnitude of the current to be measured is finally determined.

The polarized-light splitting unit 204 comprises a birefringent member 210 for splitting the linearly polarized light into the ordinary ray and the extraordinary ray, a lens 212 for guiding the linearly polarized light emitted from the output end of the optical fiber sensor 200 to the birefringent member 210, a lens 214 for guiding the ordinary ray emitted from the birefringent member 210 to the first optical fiber 206, and an optical path shift prism 216 and a lens 218 for guiding the extraordinary ray emitted from the birefringent member 210 to the second optical fiber 208. A crystal axis of the polarizer 202 and a crystal axis of the birefringent member 210 are angularly displaced at 45° relative to each other, so that the birefringent member 210 is capable of splitting the linearly polarized light from the optical fiber sensor 200 into an ordinary ray and an extraordinary ray that are orthogonal to each other.

Thus, in the transmission type optical fiber sensor, it is required to provide the two lenses 214 and 218 between the birefringent member 210 and the optical fiber sensors 206 and 208. When the separation distance is made large, the optical path shift prism 216 is also required. Consequently, an entire structure of the current measuring apparatus is large.

The present invention has been made in view of the above-described disadvantages. It is an object of the present invention to provide a current measuring apparatus which is reduced in size due to a reduction in the number of components, and which can be easily assembled.

DISCLOSURE OF THE INVENTION

To achieve the above object, the present invention provides a current measuring apparatus comprising: an optical fiber sensor extended or looped around a conductor through which a current to be measured flows, linearly polarized light emitted from a light source and propagated through the optical fiber sensor having a plane of polarization rotated under a magnetic field generated by the current to be measured; a photoelectric converter for converting into an electrical value an angle of rotation of the plane of polarization of the linearly polarized light after it exits the optical fiber sensor; and a photocircuit disposed between the optical fiber sensor and the photoelectric converter. The photocircuit includes a birefringent member having a crystal axis and arranged such that linearly polarized light emitted from the optical fiber sensor is transmitted therethrough on a light axis when it is incident along a plane orthogonal to a plane containing the crystal axis and the light axis, while the linearly polarized light is transmitted separated from the light axis and exits the birefringent member in parallel to the light axis when it is incident along the plane containing the crystal axis and the light axis. The current measuring apparatus further comprises: a plurality of optical fibers for transmitting an ordinary ray from the birefringent member of the photocircuit to the photoelectric converter, while transmitting an extraordinary ray from the birefringent member of the photocircuit to the photoelectric converter; and a maintaining means adapted to maintain the plurality of optical fibers with a gap of a predetermined size being formed therebetween, the plurality of optical fibers having one end and an opposite end, the one end of the plurality of optical fibers being disposed in the vicinity of the birefringent member, and the opposite end being connected to the photoelectric converter.

In the current measuring apparatus of the above arrangement, the light can be introduced into a core portion of each optical fiber through one end thereof provided in the vicinity of the birefringent member. Therefore, in contrast with conventional techniques, it is unnecessary to provide a lens between one end of each optical fiber and the birefringent member, so that the light can be introduced into the optical fibers using at least one lens. Therefore, a reduction in size of the current measuring apparatus can be achieved.

The present invention also provides a current measuring apparatus comprising: an optical fiber sensor extended or looped around a conductor through which a current to be measured flows, and adapted to detect an angle of Faraday rotation, under a magnetic field of the current to be measured, of linearly polarized light emitted from a light source and propagated through the optical fiber sensor; a photoelectric converter for converting the angle of Faraday rotation detected by the optical fiber sensor into an electrical value; and a photocircuit disposed between the optical fiber sensor and the photoelectric converter. The photocircuit includes a Faraday element disposed in the vicinity of an input end of the optical fiber sensor and adapted to rotate a plane of polarization of the linearly polarized light through a predetermined angle, and a light-transmitting birefringent member disposed at the photoelectric converter side of the Faraday element and adapted to separate the light emitted from the optical fiber sensor into an ordinary ray and an extraordinary ray that are orthogonal to each other. The current measuring apparatus further comprises a first optical fiber for directing the linearly polarized light to the birefringent member, while transmitting the ordinary ray emerging from the birefringent member to the photoelectric converter, and a second optical fiber for transmitting the extraordinary ray emerging from the birefringent member to the photoelectric converter. The photocircuit further includes a lens system disposed between the input end of the optical fiber sensor and the birefringent member, of which focal points are formed at an end-face core portion of the optical fiber sensor and an end-face core portion of the first optical fiber.

With this arrangement, the focal points of the lens system disposed between the input end of the optical fiber sensor and the birefringent member are formed at the end-face core portion of the optical fiber sensor and the end-face core portion of the first optical fiber for directing the linearly polarized light to the birefringent member while transmitting the ordinary ray from the birefringent member to the photoelectric converter. Therefore, only one lens system is required, so the number of components and the size of the photocircuit can be reduced. Further, an alignment operation becomes easy.

Further, in the arrangement where no lenses are provided between the birefringent member and the first and second optical fibers, if the thickness of the birefringent member is reduced, and therefore the separation distance between the ordinary and extraordinary rays is reduced, the distance between the first optical fiber and the second optical fiber can be matched to the separation distance. Therefore, the size of the photocircuit can be further reduced by reducing the thickness of the birefringent member.

In the current measuring apparatus, the lens system may be disposed between the birefringent member and the Faraday element, or between the Faraday element and the optical fiber sensor.

The birefringent member may comprise a plane-parallel plate made of a material selected from the group consisting of rutile, yttrium orthovanadate, lithium niobate and calcite.

The first and second optical fibers may be maintained parallel to each other with a gap of a predetermined size being formed therebetween by means of a gap maintaining member, such as a two-core ferrule. In this case, the size of the gap between the first and second optical fibers can be matched to a separation distance between the ordinary ray and the extraordinary ray, which is determined in relation to a thickness of, and a material for the birefringent member formed by the plane-parallel plate.

BRIEF DESCRIPTION OF THE DRAWINGS

FIG. 8($b$) is an enlarged view of an essential part of the current measuring apparatus according to the seventh embodiment of the present invention.

BEST MODE FOR CARRYING OUT THE INVENTION

Figure 1:
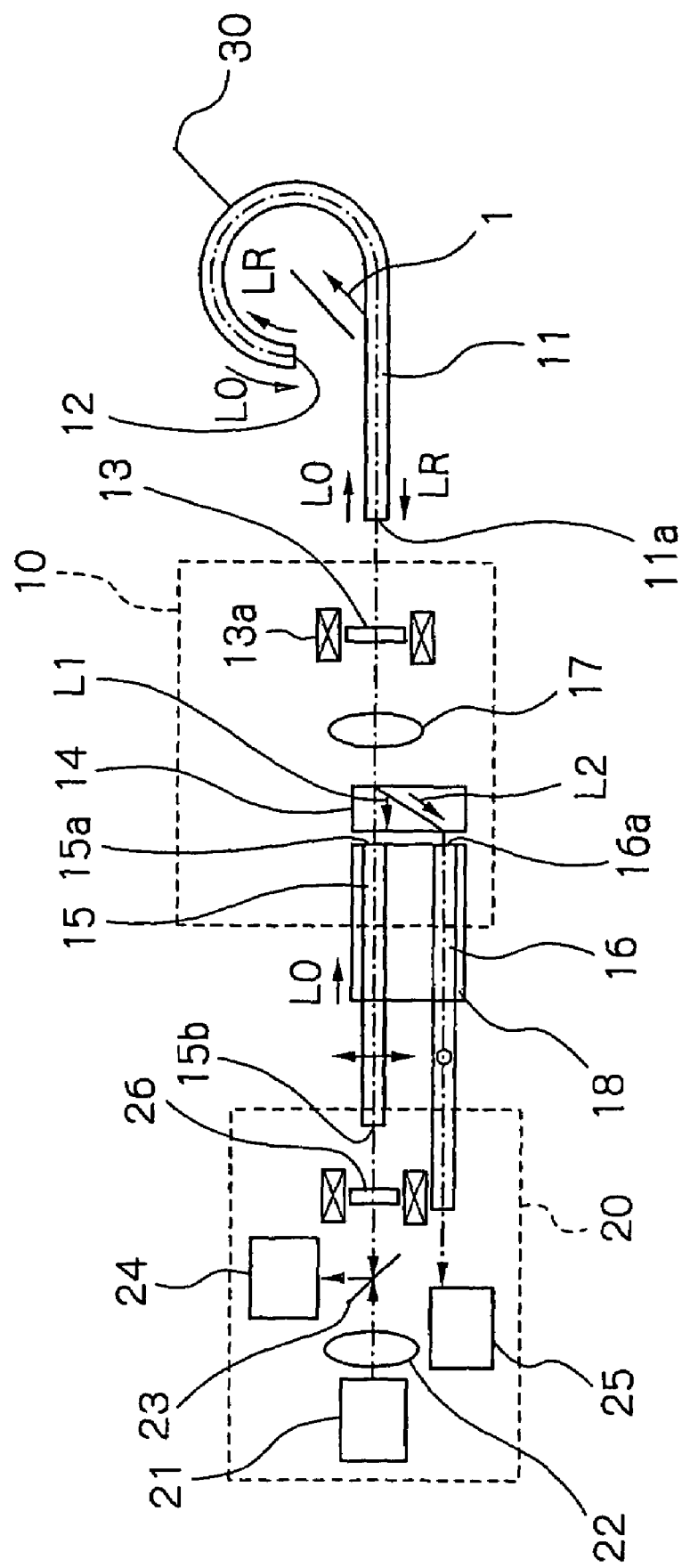
FIG. 1 is an explanatory view of an entire structure of a current measuring apparatus according to a first embodiment of the present invention.
Figure 2:
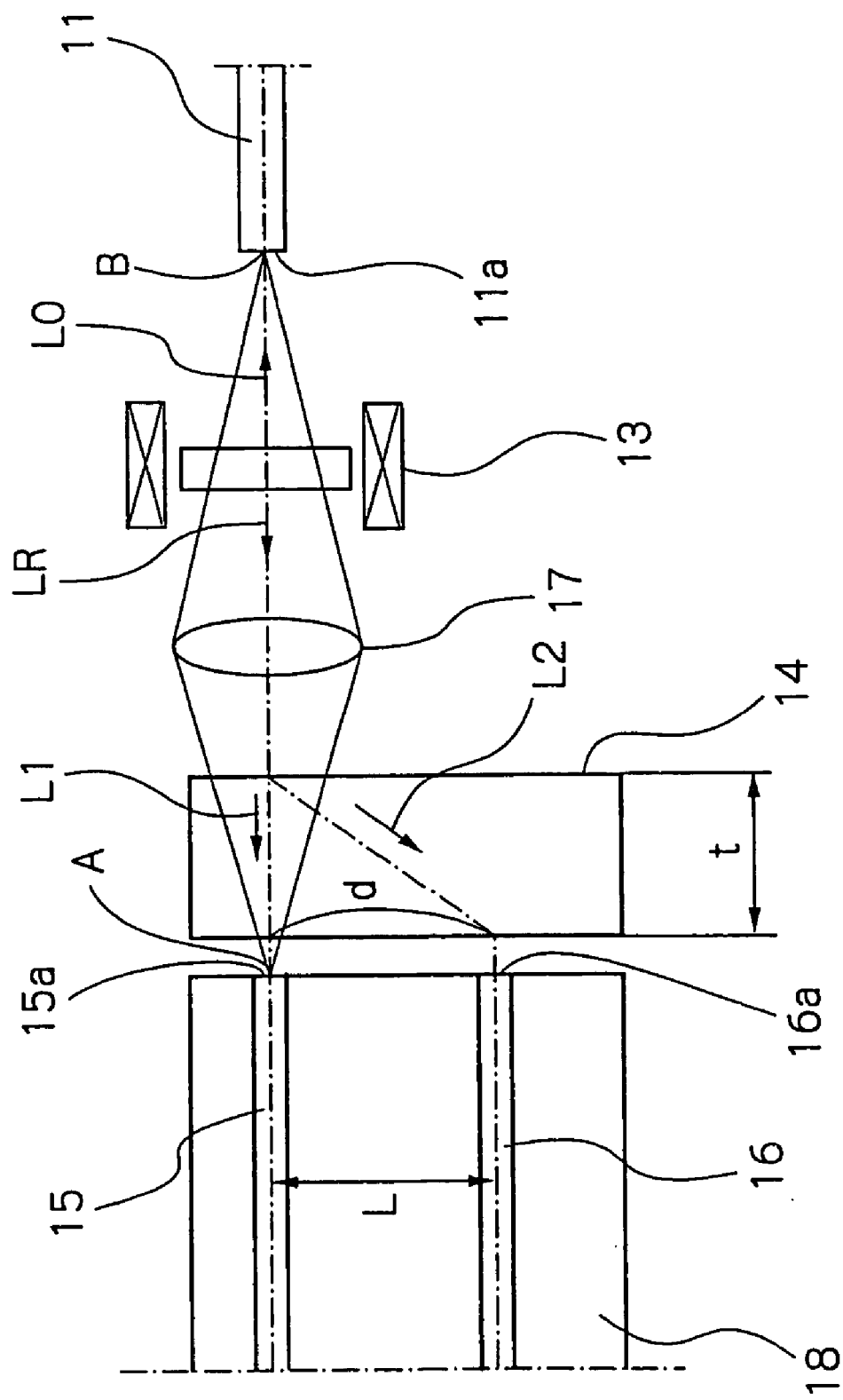
FIG. 2 is an enlarged view of an essential part of FIG. 1.

Hereinbelow, preferred embodiments of the present invention are described in detail, referring to the accompanying drawings. FIGS. 1 and 2 show a current measuring apparatus according to a first embodiment of the present invention. The current measuring apparatus shown in FIGS. 1 and 2 comprises a reflection type optical fiber sensor 11, a photocircuit 10 and a photoelectric converter 20.

The optical fiber sensor 11 is extended or looped around a conductor 30 through which a current I to be measured flows. The optical fiber sensor 11 comprises a flint glass fiber or a silica glass fiber, through which incident linearly polarized light $L_O$ or reflected linearly polarized light $L_R$ is propagated. A reflective film 12 as a reflecting member is provided at one end of the optical fiber sensor 11 so as to reflect the linearly polarized light $L_O$ which has traveled in an optical path encircling the conductor 30. Although the reflective film 12 is provided in this embodiment, this does not limit the present invention. Various elements can be employed as a reflecting member, as long as they are capable of reflecting linearly polarized light. For example, a reflection mirror can be used, which comprises a metal having low absorptivity and high reflectivity relative to light, such as gold, silver, copper, chrome or aluminum, or a multi-layered film having low absorptivity and high reflectivity relative to light.

The photocircuit 10 is a circuit for inputting, to the optical fiber sensor 11, linearly polarized light as either one of an ordinary ray or an extraordinary ray, and for splitting the linearly polarized light influenced by a magnetic field H generated by the current I into an ordinary ray and an extraordinary ray, so as to enable detection of an angle of Faraday rotation of a plane of polarization of the linearly polarized light outputted from the optical fiber sensor 11. The photocircuit 10 comprises a first Faraday element 13, a birefringent member 14, a first optical fiber 15, a second optical fiber 16 and a lens 17.

It should be noted that the photocircuit 10 and the optical fiber sensor 11 provide a current detection unit for detecting an angle of Faraday rotation in which the direction of polarization of the linearly polarized light $L_0$, $L_R$ propagated through the optical fiber sensor is rotated under the influence of the magnetic field H generated by the current I.

The first Faraday element 13 is transparent to the light and is surrounded by a magnet 13a. It is provided in the vicinity of an input end 11a of the optical fiber sensor 11 and rotates the plane of polarization of the incident linearly polarized light $L_0$ or the reflected linearly polarized light $L_R$ through 22.5°. Therefore, the plane of polarization of the linearly polarized light $L_0$ which has entered the first Faraday element 13 and the plane of polarization of the reflected linearly polarized light $L_R$ which has passed through the first Faraday element 13 are angularly displaced from each other by 45°, if there is no influence of the current I. The plane of polarization of the linearly polarized light is thus rotated through 45° so as to enable the reflected linearly polarized light $L_R$ to be split into the ordinary ray and the extraordinary ray in the birefringent member 14. The angle of Faraday rotation is determined based on these rays, and a magnitude of the current I is computed from the angle of Faraday rotation. In a transmission type optical fiber sensor described later, it is unnecessary to provide a Faraday element for 22.5°-rotation because the same effect as obtained by the 22.5°-rotation Faraday element can be obtained by providing a polarizer at an input end of the optical fiber sensor and providing a birefringent member (also called an analyzer) at an output end of the optical fiber sensor, with the crystal axis of the analyzer being displaced from the crystal axis of the polarizer by 45°. On the other hand, in a reflection type optical fiber sensor as used in this embodiment, the first Faraday element 13 for 22.5°-rotation of the plane of polarization of the linearly polarized light is provided so that angular displacement of 45° occurs between the plane of polarization of the linearly polarized light emerging from the birefringent member 14 and the plane of polarization of the reflected linearly polarized light returned to the birefringent member 14.

For determining the angle of Faraday rotation based on the ordinary and extraordinary rays, and easily and accurately computing the current from the angle of Faraday rotation, a difference in angle between the plane of polarization of the linearly polarized light emerging from the birefringent member 14 and the plane of polarization of the reflected linearly polarized light returned to the birefringent member 14 is most preferably 45°, in the absence of the magnetic field of the current to be measured. However, this does not limit the present invention. The purpose of setting the first Faraday element 13 for 22.5°-rotation is to obtain a maximum range of currents to be measured. The current measuring apparatus is still operative if the range of currents to be measured is relatively narrow. Therefore, the first Faraday element 13 may be adapted to rotate a plane of polarization through an angle smaller or larger than 22.5°.

The birefringent member 14 is transparent to the light and is provided at the photoelectric converter 20 side of the first Faraday element 13. The birefringent member 14 comprises a birefringent member having a crystal axis such that an ordinary ray and an extraordinary ray exit the birefringent member 14 parallel to each other. The birefringent member 14 functions to transmit the linearly polarized light on a light axis when it is incident along a plane orthogonal to a plane containing the crystal axis and the light axis. When the linearly polarized light is incident on the birefringent member 14 along the plane containing the crystal axis and the light axis, the linearly polarized light is transmitted separated from the light axis and exits the birefringent member 14 in parallel to the light axis. When the linearly polarized light is incident along a plane other than the above two orthogonal planes, the intensity of light is divided into vector components; and an ordinary ray is transmitted on the light axis and an extraordinary ray is separated from the light axis and exits in parallel to the light axis. Thus, the birefringent member 14 splits the light emitted from the optical fiber sensor 11 into an ordinary ray $L_1$ and an extraordinary ray $L_2$ that are orthogonal to each other, and passes the linearly polarized light $L_0$ emitted from a light source which is described later.

The birefringent member 14 is made of a material selected from the group consisting of birefringent crystals having properties indicated in the table below, that is, rutile, yttrium orthovanadate, lithium niobate and calcite.

The selected material is formed into a plane plate having a predetermined thickness t and having two opposed surfaces parallel to each other, to thereby obtain the birefringent member 14. The birefringent member 14 is disposed in a manner such that one of the parallel plane surfaces faces the end faces of the first optical fiber 15 and the second optical fiber 16, and the other surface faces the lens 17.

In the birefringent member 14 thus arranged, the reflected linearly polarized light $L_R$ incident on one plane surface of the birefringent member 14 is split into the ordinary light $L_1$ and the extraordinary light $L_2$, which then emerge from the other plane surface of the birefringent member 14 parallel to each other with a predetermined separation distance d.

Properties of Birefringent Crystals

| Birefringent crystal | | TiO$_2$ Rutile | YVO$_4$ Yttrium orthovanadate | LiNbO$_3$ Lithium niobate | CaCO$_3$ Calcite |
|---|---|---|---|---|---|
| Coefficient of thermal expansion (/° C.) | c-axis | $9.19 \times 10^{-6}$ | $11.37 \times 10^{-6}$ | $16.7 \times 10^{-6}$ | $5.68 \times 10^{-6}$ |
| | a-axis | $7.14 \times 10^{-6}$ | $4.43 \times 10^{-6}$ | $7.0 \times 10^{-6}$ | $24.39 \times 10^{-6}$ |
| Refractivity @ 1.55 μm | no | 2.452 | 1.938 | 2.219 | 1.6629 |
| | ne | 2.709 | 2.138 | 2.14 | 1.4885 |
| Birefringence @ 1.55 μm | | −0.257 | −0.2 | 0.079 | 0.1744 |
| Crystal structure | | Positive single-axis crystal | Positive single-axis crystal | Negative single-axis crystal | Negative single-axis crystal |
| Mohs hardness | | 6.5 | 5 | 5 | 3 |
| Environmental resistance | | Satisfactory | Satisfactory | Satisfactory | Deliquescent properties |
| Angle (°) between a crystal axis and an incident beam, in which a maximum separation distance between an ordinary ray and an extraordinary ray is obtained | | 47.8 | 47.8 | 44 | 41.9 |
| Beam separation distance (mm) when a thickness t (mm) of crystal is 1 | | 0.099841 | 0.098372 | 0.036259 | 0.111021 |

The first optical fiber 15 comprises a polarization preserving fiber, and is disposed such that an end face 15*a* at one end of the first optical fiber 15 is located in the vicinity of the birefringent member 14. That is, the end face 15*a* can be disposed at a slight distance from the birefringent member 14 or in contact with the birefringent member 14. Consequently, the first optical fiber 15 is enabled to emit the linearly polarized light L$_0$ into the birefringent member 14 while outputting the ordinary ray L$_1$ emitted from the birefringent member 14 to the photoelectric converter 20.

The second optical fiber 16 comprises a conventional single-mode optical fiber, a multi-mode optical fiber or a polarization preserving fiber. In substantially the same manner as in the case of the first optical fiber 15, an end face 16*a* at one end of the second optical fiber 16 is disposed in the vicinity of the birefringent member 14. That is, the end face 16*a* can be disposed at a slight distance from, or in contact with the birefringent member 14. Consequently, the second optical fiber 16 is enabled to transmit the extraordinary ray L$_2$ emitted from the birefringent member 14 to the photoelectric converter 20.

In this embodiment, the first optical fiber 15 and the second optical fiber 16 are held by a two-core ferrule 18 so that a gap of a predetermined size L is formed therebetween. The end face 15*a* and the end face 16*a* at one end of the first optical fiber 15 and the second optical fiber 16 are flush with each other.

The predetermined size L of the gap is determined, depending on the thickness t of the birefringent member 14 comprising a plane-parallel plate and the properties of the selected material. That is, with respect to the birefringent crystals indicated in Table 1, the separation distance d between the ordinary ray L$_1$ and the extraordinary ray L$_2$ is determined in accordance with the following formula (d=L).

$$d = t \times (nn - no)/\lambda$$

wherein $$nn = \sqrt{\frac{ne^2 \cdot no^2}{ne^2 \cdot \cos^2\alpha + no^2 \cdot \sin^2\alpha}}$$

d: separation distance between the ordinary ray L$_1$ and the extraordinary ray L$_2$ t: thickness of the birefringent member 14 no: ordinary index of the birefringent member 14 ne: extraordinary index of the birefringent member 14

α: angle formed by an incidence angle and a crystal optical axis of the birefringent member 14

λ: optical wavelength

In the birefringent member 14 formed by a plane-parallel plate, the ordinary ray L$_1$ and the extraordinary ray L$_2$ emerging from the birefringent member 14 are parallel to each other. Therefore, when the separation distance d is determined, by matching the predetermined size L of the gap to the separation distance d, the ordinary and extraordinary rays are enabled to be introduced into respective core portions of the first optical fiber 15 and the second optical fiber 16.

With respect to the two-core ferrule 18, a two-core ferrule of standard design with a gap of 125 μm is commercially available. Such a standard ferrule can be utilized by setting the thickness of the birefringent member 14 so that the separation distance d matches this gap, which is advantageous in terms of economy.

A means to maintain the first optical fiber 15 and the second optical fiber 16 with a gap of a predetermined size being formed therebetween is not limited to the two-core ferrule 18. For example, a clamping type gap-maintaining member having two parallel V-shaped grooves may be used, in which the first optical fiber 15 and the second optical fiber 16 are positioned by insertion into the V-shaped grooves.

In this embodiment, the lens 17 is a single lens. It is disposed between the first Faraday element 13 and the birefringent member 14, and, as indicated in FIG. 2, focal points A and B are formed at the core portions of the input end 11a of the optical fiber sensor 11 and the end face 15a of the first optical fiber 15.

In this embodiment, the input end 11a of the optical fiber sensor 11 and the end face 15a of the first optical fiber 15 are vertically oriented surfaces that are perpendicular to respective optical axes of the optical fiber sensor 11 and the first optical fiber 15. Each focal point of the lens 17 is formed substantially at the center of the core portion of each fiber.

The photoelectric converter 20 comprises a light source 21, a lens 22, a polarization separation prism 23, first and second photoelectric converter elements 24 and 25 and a second Faraday element 26.

The light source 21 comprises, for example, a semiconductor laser, and emits light having a predetermined wavelength λ. The lens 22 is located forward of the light source 21, and collects the light emitted from the light source 21. The light collected by the lens 22 enters the polarization separation prism 23.

The polarization separation prism 23 transmits and polarizes the light from the light source 21 while reflecting the ordinary ray from the first optical fiber 15 toward the first photoelectric converter element 24.

Each of the first photoelectric converter element 24 and the second photoelectric converter element 25 comprises a photodiode, which receives the light and converts it into an electrical signal. The second Faraday element 26 is located forward of the polarization separation prism 23, and rotates the incident linearly polarized light through 45°. The second Faraday element 26 for 45°-rotation of the linearly polarized light is provided so as to cause 90°-displacement between the plane of polarization of the linearly polarized light traveling in a forward direction and the plane of polarization of the reflected linearly polarized light travelling in a reverse direction, thus enabling the linearly polarized light traveling in the reverse direction to be refracted at the polarization separation prism 23 and fully injected into the first photoelectric converter element 24.

The other end 15b of the first optical fiber 15 is located forward of the second Faraday element 26 in proximity thereof. The second photoelectric converter element 25 is adapted to receive the light from the second optical fiber 16.

In the current measuring apparatus arranged as mentioned above, light emitted from the light source 21 travels through the lens 22 and the polarization separation prism 23 and enters the second Faraday element 26, in which the plane of polarization of the light is rotated through 45°. Then, the light is emitted from the second Faraday element 26 as linearly polarized light $L_0$. The linearly polarized light $L_0$ travels through the first optical fiber 15, the birefringent member 14, the lens 17 and the first Faraday element 13, and reaches the input end 11a of the optical fiber sensor 11. The light is injected into the optical fiber sensor 11 through the input end 11a. When the linearly polarized light $L_0$ passes through the birefringent member 14, its plane of polarization is incident along the plane orthogonal to the plane containing the crystal axis of the birefringent member 14 and the light axis. Therefore, the linearly polarized light $L_0$ travels on the light axis through the birefringent member 14.

The linearly polarized light $L_0$ which has passed through the lens 17 enters the first Faraday element 13, in which the plane of polarization is rotated through 22.5°. The state of polarization at this time is indicated by $L_0'$. The linearly polarized light $L_0'$ which has entered the optical fiber sensor 11 is propagated through the optical fiber sensor 11 and reaches the other end of the optical fiber sensor 11. The light is reflected by the reflective film 12 and returns to the input end 11a as reflected linearly polarized light $L_R$.

The optical fiber sensor 11 is extended or looped around the conductor 30 through which the current I to be measured flows. Therefore, the plane of polarization of the linearly polarized light $L_0'$ or the reflected linearly polarized light $L_R$, when propagated through the optical fiber sensor 11, is subject to the current-induced magnetic field, and is rotated through an angle corresponding to the magnitude of the current I.

The reflected linearly polarized light $L_R$ emitted from the input end 11a passes through the first Faraday element 13. In this instance, the plane of polarization is further rotated through 22.5° relative to $L_0'$, and passes through the lens 17 and enters the birefringent member 14.

The plane of polarization of the reflected linearly polarized light $L_R$ incident on the birefringent member 14 is angularly displaced from the plane of polarization of the linearly polarized light $L_0$ by 45°+α° (α° is an angle influenced by the current to be measured). Therefore, in the birefringent member 14, the reflected linearly polarized light $L_R$ is split into the ordinary ray $L_1$ and the extraordinary ray $L_2$ which are orthogonal to each other. The ordinary ray $L_1$ exits the birefringent member 14 along the plane orthogonal to the plane containing the crystal axis of the birefringent member 14 and the light axis. The extraordinary ray $L_2$ exits the birefringent member 14 after being separated from the light axis. The ordinary ray $L_1$ travels through the first optical fiber 15 and is received by the first photoelectric converter element 24, in which the light is converted into an electrical signal. The extraordinary ray $L_2$ travels through the second optical fiber 16 and is received by the second photoelectric converter element 25, in which the light is converted into an electrical signal.

The electrical signals obtained by the first photoelectric converter element 24 and the second photoelectric converter element 25 are outputted to a logic circuit such as that disclosed in, for example, a technical essay published in 1996 [IEEJ Transactions (Denki Gakkai Ronbunshi) B, Vol. 116, No.1, 93 to 103]. The logic circuit conducts predetermined computations, to thereby determine a magnitude of the current I to be measured.

An average intensity ratio between the ordinary ray $L_1$ and the extraordinary ray $L_2$ separated in the birefringent member 14 is 1:1, if the angle of rotation of the plane of polarization caused by the first Faraday element 13 has no temperature dependence.

However, the present inventors have found that the angle of rotation of the plane of polarization caused by the first Faraday element 13 does have temperature dependence. Therefore, a measurement error occurs if the temperature dependence is not taken into consideration. Therefore, in this embodiment, an average value of an index of modulation (an AC component/a DC component) is computed with respect to each of the two electrical signals obtained by the first photoelectric converter element 24 and the second photoelectric converter element 25.

With this computation, it is possible to compensate for a variation in the angle of rotation of the plane of polarization due to a temperature characteristic of the first Faraday element 13. Thus, it is possible to efficiently receive the light to be measured that is emitted from the photocircuit 10, while conducting accurate measurement.

In the current measuring apparatus arranged as mentioned above, only a single lens 17 is provided between the first Faraday element 13 and the birefringent member 14 because the focal points of the lens 17 can be respectively formed at an end-face core portion of the optical fiber sensor 11 and an end-face core portion of the first optical fiber 15, which outputs the linearly polarized light $L_0$ into the birefringent member 14 while outputting the ordinary ray $L_1$ from the birefringent member 14 to the photoelectric converter 20. Therefore, a reduction in the number of components of the photocircuit 10 and the size of the photocircuit 10 can be achieved. Further, optical alignment can be easily conducted.

Further, it is unnecessary to provide lenses between the birefringent member 14 and the first and second optical fibers 15 and 16. Even when the birefringent member 14 is thinned and the separation distance d between the ordinary ray $L_1$ and the extraordinary ray $L_2$ is reduced, the size L of the gap between the first optical fiber 15 and the second optical fiber 16 can be matched to the separation distance d. Therefore, in contrast with conventional systems, no problem is encountered by thinning the birefringent member 14, and the current measuring apparatus can be further reduced in size.

Figure 3:
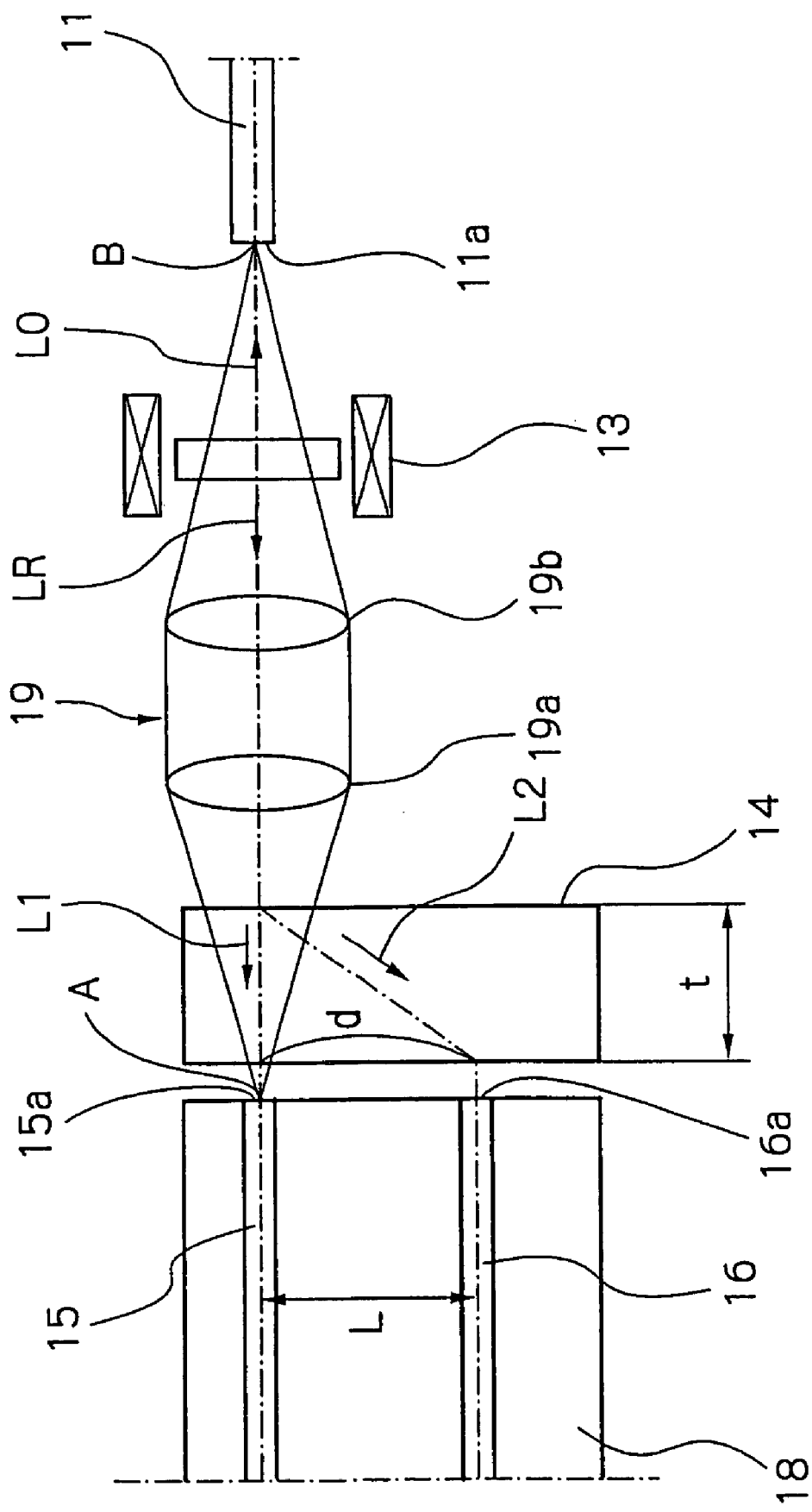
FIG. 3 is an enlarged view of an essential part of a current measuring apparatus according to a second embodiment of the present invention.

FIG. 3 shows a current measuring apparatus according to a second embodiment of the present invention. The portions which are the same as or correspond to those in the above embodiment are designated by the same reference numerals as used in the above embodiment, and explanation thereof is omitted. In the following explanation, only characteristic features of the second embodiment are described in detail.

In the embodiment of FIG. 3, as in the above embodiment, the photocircuit 10 comprises the first Faraday element 13, the light-transmitting birefringent member 14, the first optical fiber 15 and the second optical fiber 16.

A lens system 19 is interposed between the birefringent member 14 and the first Faraday element 13. The lens system 19 comprises two lenses 19a and 19b facing each other in a predetermined spaced relationship.

One lens 19a is disposed, such that its focal point A is formed at the core portion of the end face 15a of the first optical fiber 15. The other lens 19b is disposed, such that its focal point B is formed at the core portion of the entrance surface 11a of the optical fiber sensor 11.

The distance between the lens 19a and the lens 19b is determined so that the light between the lenses 19a and 19b forms parallel light rays.

In the second embodiment, the number of lenses is increased by one as compared to the first embodiment. However, collimate lenses having a simple construction can be used as the lenses 19a and 19b. Therefore, the size of each lens can be small, and accordingly the entire structure of the current measuring apparatus can be reduced in size.

By using the lens system 19, the mode field of each of the fibers 11 and 15 and space propagation light can be matched, thus reducing insertion loss.

Figure 4:
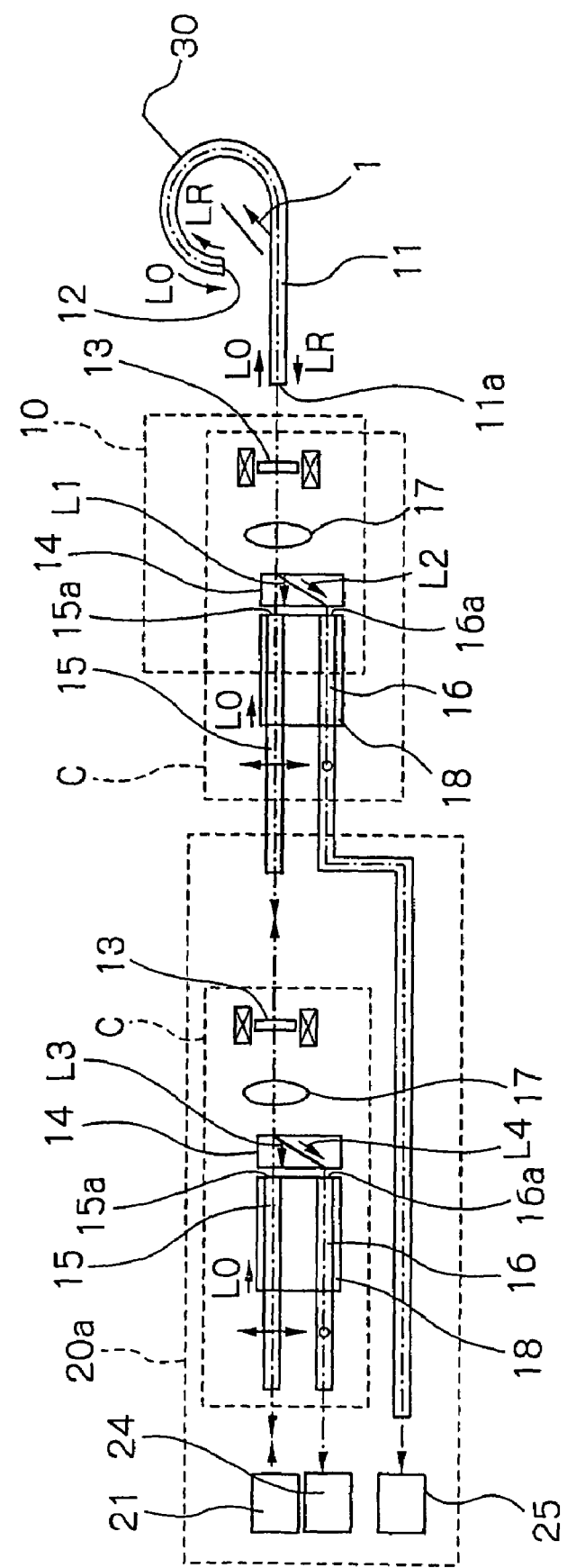
FIG. 4 is an explanatory view of an entire structure of a current measuring apparatus according to a third embodiment of the present invention.

FIG. 4 shows a current measuring apparatus according to a third embodiment of the present invention. The portions which are the same as or correspond to those in the above embodiments are designated by the same reference numerals as used in the above embodiments, and explanation thereof is omitted. In the following explanation, only characteristic features of the third embodiment are described in detail.

In the above embodiments, the lens system 17 or 19 is provided between the birefringent member 14 and the first Faraday element 13. However, this does not limit the present invention. The lens system 17 or 19 may be provided between the first Faraday element 13 and the optical fiber sensor 11, as long as the focal points are formed at the end-face core portions of the optical fiber sensor 11 and the first optical fiber 15.

In the embodiment of FIG. 4, a structure of the photocircuit 10 is substantially the same as that in the first embodiment shown in FIG. 1. A structure of a photoelectric converter 20a is characteristic. That is, the photoelectric converter 20a in this embodiment comprises the light source 21 and the first and second photoelectric converter elements 24 and 25 as in the first embodiment, but includes, instead of the polarization separation prism 23, a portion C (a portion surrounded by a one-dot chain line in FIG. 1) substantially corresponding to the photocircuit 10 in the first embodiment.

The portion C comprises the first Faraday element 13 or 13', the birefringent member 14, the first optical fiber 15, the second optical fiber 16, the lens 17, and the first and second optical fibers 15 and 16 held by the ferrule 18.

In the third embodiment arranged as mentioned above, the photocircuit 10 and the photoelectric converter 20a have the advantage of having similar components, which means that the components of the apparatus are less diversified. This provides the added advantage of ease of assembly when forming the components into a unit.

It should be noted that the angle of Faraday rotation in the first Faraday element 13' in the photoelectric converter 20a shown in FIG. 4 is 45°, and the angle of Faraday rotation in the first Faraday element 13 of the photocircuit 10 in FIG. 4 is 22.5°.

Figure 5:
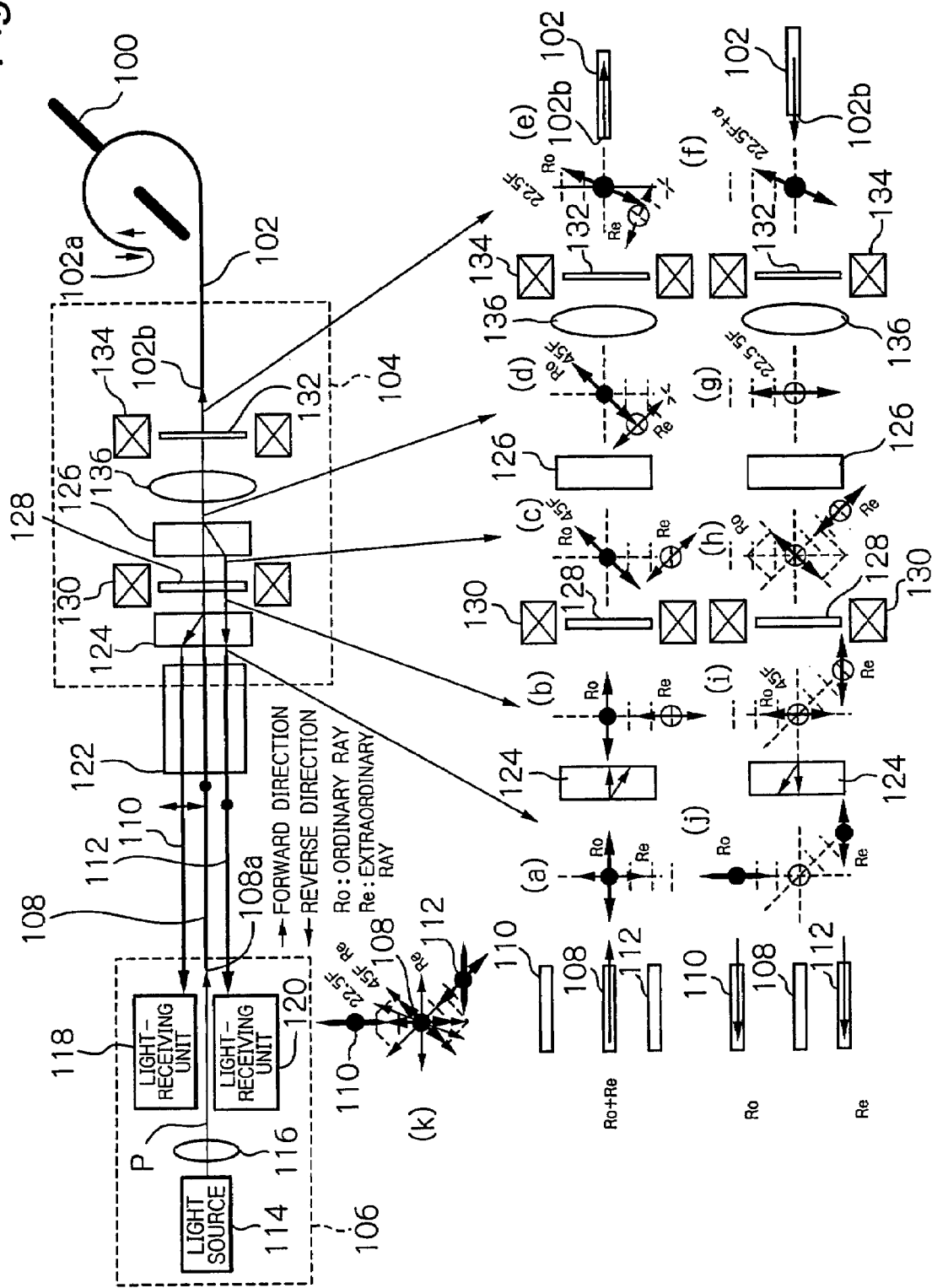
FIG. 5 is an explanatory view of an entire structure of a current measuring apparatus according to a fourth embodiment of the present invention.

Next, referring to FIG. 5, a current measuring apparatus according to a fourth embodiment is described.

In the current measuring apparatus in the fourth embodiment, measurement is made with respect to an angle of rotation of linearly polarized light in a current detection optical fiber sensor 102, which is caused by the Faraday effect under a magnetic field produced by a current flowing through a conductor 100. This current measuring apparatus comprises the optical fiber sensor 102 for detecting a current flowing through the conductor 100, a photocircuit 104, a photoelectric converter 106 for converting an optical value from the photocircuit 104 into an electrical value and optical fibers 108, 110 and 112 for connecting the photocircuit 104 and the photoelectric converter 106. The photocircuit 104 is a circuit for inputting, to the optical fiber sensor 11, linearly polarized light obtained from the linearly polarized light or randomly polarized light emitted from a light source 114. It is also adapted to separate the linearly polarized light influenced by the magnetic field H of the current I to be measured into an ordinary ray and an extraordinary ray, so as to enable detection of an angle of Faraday rotation of a plane of polarization of the linearly polarized light emitted from the optical fiber sensor 11.

The photoelectric converter 106 comprises the light source 114, such as an LD (a semiconductor laser), an LED (a light-emitting diode) or an SLD (a super luminescent diode), a lens 116 for focusing the light from the light source 114 at an input end 108a of the polarization preserving optical fiber 108, and two light-receiving units 118 and 120. The light source 114, the lens 116 and the two light-receiving units 118 and 120 are provided in the same housing. Three optical fibers, namely, the two optical fibers (single-mode fibers or multi-mode fibers) 110 and 112 and the polarization preserving optical fiber 108, extend from the photoelectric converter 106 toward the photocircuit 104.

The photocircuit 104 comprises a three-core ferrule 122 for holding the optical fibers, a first birefringent member 124, a second birefringent member 126, a 45°-rotation Faraday element 128, a magnet 130 for imparting a magnetic filed to the 45°-rotation Faraday element, a 22.5°-rotation Faraday element 132, a magnet 134 for imparting a magnetic field to the 22.5°-rotation Faraday element, and a lens 136 provided between the second birefringent member 126 (a) through (e). The direction of travel of the light from the reflective mirror to the light-receiving units is referred to as "the reverse direction". The light travelling in the reverse direction is indicated in (f) through (j).

FIG. 5(*a*) through (*j*) schematically indicate planes of polarization of an ordinary ray Ro and an extraordinary ray Re.

In the forward direction, randomly polarized light emitted from the light source 114 is coupled to the input end 108*a* of the polarization preserving optical fiber 108 by means of the lens 116. Then, the light passes through the three-core ferrule 122 and enters the first birefringent member 124 [see FIG. 5(*a*)].

In the first birefringent member 124, the light is separated into the ordinary ray Ro as linearly polarized light and the extraordinary ray Re as linearly polarized light [see FIG. 5(*b*)]. The crystal axis of the first birefringent member 124 is disposed at $\alpha=47.8°$. Therefore, the ordinary ray Ro, which oscillates in a plane perpendicular to a plane containing the crystal axis and the light axis, is transmitted on the light axis and exits the first birefringent member 124 in accordance with the Snell laws of refraction, and the extraordinary ray Re, which oscillates in the plane containing the crystal axis, is refracted when passed through the first and the 22.5°-rotation Faraday element 132.

The three optical fibers are provided in the three-core ferrule 122. The polarization preserving optical fiber 108, the optical fiber 110 and the optical fiber 112 are held with a gap of a predetermined size being formed therebetween. FIG. 5(*k*) indicates a pattern of disposition of the polarization preserving optical fiber 108, the optical fiber 110 and the optical fiber 112 as the three-core ferrule 122 is viewed from the light source 114. As indicated in FIG. 5(*k*), the polarization preserving optical fiber 108 is positioned at the center by means of the three-core ferrule 122. The optical fiber 110 is positioned on the upper side in FIG. 5(*k*), and the optical fiber 112 is positioned on the lower right side in FIG. 5(*k*).

The current-sensing optical fiber sensor 102 extends from the photocircuit 104. The optical fiber sensor 102 comprises a flint glass fiber. A reflective mirror 102*a* is attached to a forward end of the optical fiber sensor 102.

Next, an operation of this embodiment is explained, referring to FIG. 5(*a*) to (*j*).

The direction of travel of the light from the light source 114 to the reflective mirror 102*a* at the forward end of the optical fiber sensor 102 is referred to as "the forward direction". The light travelling in the forward direction is indicated in birefringent member and is separated from the ordinary ray in a direction away from the light axis P.

Then, by means of the 45°-rotation Faraday element 128, planes of polarization of the ordinary ray Ro and the extraordinary ray Re are rotated through 45°, and enter the second birefringent member 126 [see FIG. 5(*c*)].

The crystal axis of the second birefringent member 126 lies in a plane perpendicular to the 45°-rotated plane of polarization of the ordinary ray Ro. Therefore, the ordinary ray Ro is transmitted on the light axis through the second birefringent member 126 as the ordinary ray Ro. On the other hand, the extraordinary ray Re consisting of a wave oscillating in the plane containing the crystal axis of the second birefringent member 126 is displaced before it exits the second birefringent member 126 [see FIG. 5(*d*)].

Of the ordinary ray Ro and the extraordinary ray Re which have passed through the 22.5°-rotation Faraday element 132, only the ordinary ray Ro is coupled to an input end 102*b* of the optical fiber sensor 102 by means of the lens 136 [see FIG. 5(*e*)]. By means of the 22.5°-rotation Faraday element 132, respective planes of polarization of the ordinary ray Ro and the extraordinary ray Re are rotated through 22.5° [see FIG. 5(*d*)]. Then, as mentioned above, only the ordinary ray Ro is emitted into the optical fiber sensor 102 by the action of the lens 136. The extraordinary ray Re, which is separated and directed away from the light axis P, does not enter the optical fiber sensor 102. An arrangement may be made, such that only the extraordinary ray Re enters the optical fiber sensor 102. For selecting either the ordinary ray Ro or the extraordinary ray Re as the light emitted into the optical fiber sensor 102, the light with its plane of polarization having a high optical power should be selected, from the viewpoint of high sensing performance.

The ordinary ray Ro when passed through the optical fiber sensor 102 is subject to a magnetic field dependent on the current of the wire 100. Due to the Faraday effect, the plane of polarization of the ordinary ray rotates according to the strength of the magnetic field (this rotation is hereinafter referred to as "the Faraday rotation"). The total internal reflection mirror 102*a* is provided at the terminal end of the optical fiber sensor 102. The reflective mirror 102*a* causes total internal reflection of the ordinary ray Ro, which in turn travels backwards, thus becoming reverse light (that is, linearly polarized light travelling in the reverse direction). The reverse linearly polarized light after total internal reflection is further subjected to the Faraday rotation in the flint glass fiber [see FIG. 5(*f*)], and enters the 22.5°-rotation Faraday element. A total of the Faraday rotations in the flint glass fiber is indicated by $\alpha°$.

In the 22.5°-rotation Faraday element, the plane of polarization of the reverse light is further rotated through 22.5° [see FIG. 5(*g*)].

Therefore, the plane of polarization of the reverse linearly polarized light which has passed through the 22.5°-rotation Faraday element 132 and the lens 136 is angularly displaced by $45°+\alpha$, relative to the plane of polarization of the ordinary ray Ro at the same position in the forward direction. As mentioned above, a is an angle of Faraday rotation dependent on the magnetic field strength, which is obtained by propagating the light in the forward and backward directions through the optical fiber sensor 102.

The reverse linearly polarized light, when passed through the second birefringent member 126, is split into the ordinary ray Ro and the extraordinary ray Re [see FIG. 5(*h*)], since the reverse linearly polarized light is displaced by $45°+\alpha$ relative to the plane of polarization of the light in the forward direction in the second birefringent member 126. The plane of polarization of the ordinary ray Ro exits the second birefringent member 126 along the plane perpendicular to the plane containing the crystal axis of the second birefringent member 126 and the light axis. The extraordinary ray Re exits the second birefringent member 126 with a wave oscillating in the plane containing the crystal axis and the light axis. That is, the planes of polarization of the ordinary ray and the extraordinary ray, which are separated during transmission through the second birefringent member 126, are separated based on the crystal axis of the second birefringent member. The plane of polarization of the ordinary ray Ro lies in the plane perpendicular to the plane containing the crystal axis and the light axis, and the plane of polarization of the extraordinary ray Re is perpendicular to the plane that is perpendicular to the plane containing the crystal axis and the light axis.

A light intensity ratio between the ordinary ray and the extraordinary ray is indicated as follows. When the intensity of the light before transmission through the second birefringent member is represented by P, the intensity of the ordinary ray Ro is indicated by $Ro=P \cdot \cos^2 (45+\alpha)$, and the intensity of the extraordinary ray Re is indicated by $Re=P \cdot \sin^2 (45+\alpha)$. $\alpha$ is an angle of Faraday rotation dependent on the magnetic field strength obtained by propagating the light in the forward and backward directions through the optical fiber sensor 102.

The planes of polarization of the ordinary ray Ro and the extraordinary ray Re when passed through the 45°-rotation Faraday element 128 are rotated through 45° [see FIG. 5(i)], and enter the first birefringent member 124.

In the first birefringent member 124, the ordinary ray Ro is displaced. The reason for this is that the ordinary ray in the forward direction passes through the 45°-rotation Faraday element 128, in which the plane of polarization thereof is rotated through 45°, and passes in the reverse direction through the second birefringent member and the 45°-rotation Faraday element 128, in which the plane of polarization thereof is further rotated through 45°. That is, light having a total angle of rotation of 90° enters the first birefringent member 124, and behaves as an extraordinary ray. The direction of displacement traces that in the forward direction [see FIG. 5(j)]. Consequently, the ordinary ray Ro and the extraordinary ray Re which have passed through the first birefringent member 124 do not return to the polarization preserving optical fiber 108, through which they traveled in the forward direction, and are coupled to the remaining two optical fibers 110 and 112. The ordinary ray Ro is guided to the light-receiving unit 118 through the optical fiber 110, and the extraordinary ray Re is guided to the light-receiving unit 120 through the optical fiber 112. The ordinary ray Ro and the extraordinary ray Re are respectively converted into electrical signals by the light-receiving units 118 and 112. Thereafter, by means of an arithmetic processing unit (not shown), an average value of an index of modulation (an AC component/a DC component) is computed with respect to each of the two electrical signals obtained by the light-receiving units 118 and 112. With this computation, as described above, it is possible to efficiently receive the light for measurement that is emitted from the photocircuit 10, while conducting accurate measurement by compensating for a variation in the angle of rotation of the plane of polarization due to the temperature characteristics of the Faraday elements 128 and 132.

The angle of the 45°-rotation Faraday element and the angle of the 22.5°-rotation Faraday element are most preferable values of an angle of Faraday rotation. However, these values do not limit the present invention. These angles are optimum. Deviation from these values does not affect an essential function of the present invention. It should be noted, however, that such deviation may result in light loss, a narrow range of currents to be measured or low measurement accuracy.

Various patterns of disposition of the optical fibers in the three-core ferrule can be considered, depending on the directions of the crystal axes of the two birefringent members and the directions of the magnetic fields of the magnets 130 and 134 imparted to the two Faraday elements 128 and 132, and which of the ordinary ray and the extraordinary ray is coupled to the optical fiber 102 after transmission through the 22.5°-Faraday element in the forward direction.

Figure 6:
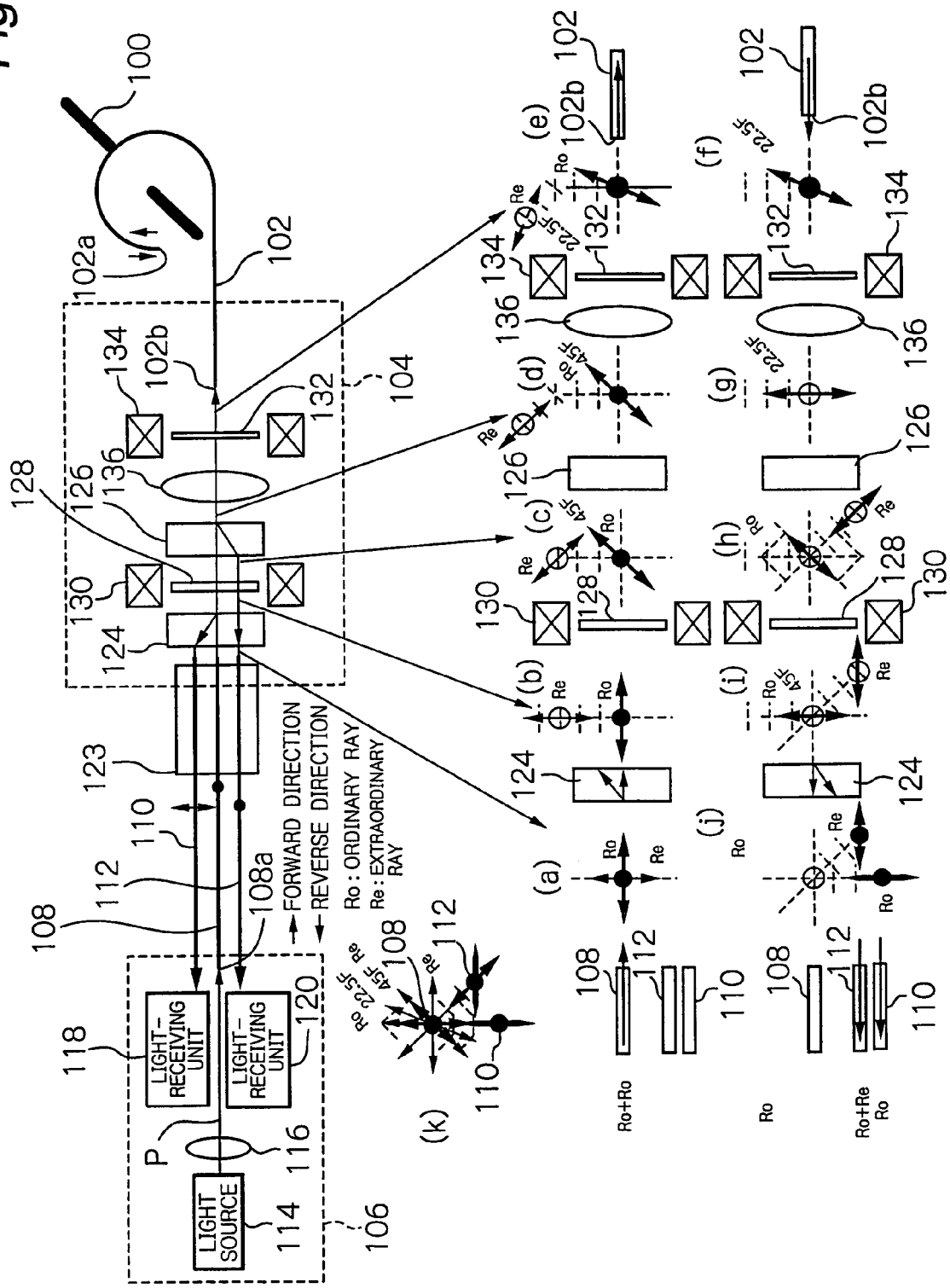
FIG. 6 is an explanatory view of an entire structure of a current measuring apparatus according to a fifth embodiment of the present invention.

FIG. 6 is a schematic view of an arrangement of a current measuring apparatus according to a fifth embodiment of the present invention, in which the pattern of disposition of the optical fibers in the three-core ferrule is changed. In FIG. 6, the same portions as shown in FIG. 5 are designated by the same reference numerals as used in FIG. 5, and overlapping explanation is omitted.

A three-core ferrule 123 holds the three optical fibers 108, 110 and 112. With this arrangement, the polarization preserving optical fiber 108, the optical fiber 110 and the optical fiber 112 are held with a gap of a predetermined size being formed therebetween. FIG. 6(k) indicates a pattern of disposition of the polarization preserving optical fiber 108, the optical fiber 110 and the optical fiber 112 as the three-core ferrule 122 is viewed from the light source 114. As indicated in FIG. 6(k), the polarization preserving optical fiber 108 is positioned at the center by means of the three-core ferrule 123. The optical fiber 110 is positioned on the lower right side in FIG. 6(k), and the optical fiber 112 is positioned vertically below the polarization preserving optical fiber 108.

The crystal axis of the first birefringent member 124 shown in FIG. 5 extends upward along the light axis. The crystal axis of the first birefringent member 124 shown in FIG. 6 extends downward along the light axis. Therefore, with respect to the light in the forward direction, in the embodiment of FIG. 5, the extraordinary ray Re is displaced downward by means of the first birefringent member 124 [see FIG. 5(b)]. In the embodiment of FIG. 6, the extraordinary ray Re is displaced upward by means of the first birefringent member 124. On the other hand, with respect to the light in the reverse direction, in the first birefringent member 124, the ordinary ray Ro is displaced downward. The direction of displacement traces that in the forward direction [see FIG. 6(j)]. Consequently, the ordinary ray Ro and the extraordinary ray Re which have been transmitted through the first birefringent member 124 do not return to the polarization preserving optical fiber 108, through which they traveled in the forward direction, and are coupled to the remaining two optical fibers 110 and 112.

The ferrule pattern of the three-core ferrule (the pattern of disposition of the polarization preserving optical fiber and the optical fibers) depends on the crystal axis of the second birefringent member 126 and the crystal axis of the first birefringent member 124. In the embodiment of FIG. 5, the crystal axis of the second birefringent member 126 is inclined at 45 degrees relative to the crystal axis of the first birefringent member 124. In this case, not only the ferrule pattern shown in FIG. 5, but also the ferrule pattern shown in FIG. 6 may be employed.

Figure 7:
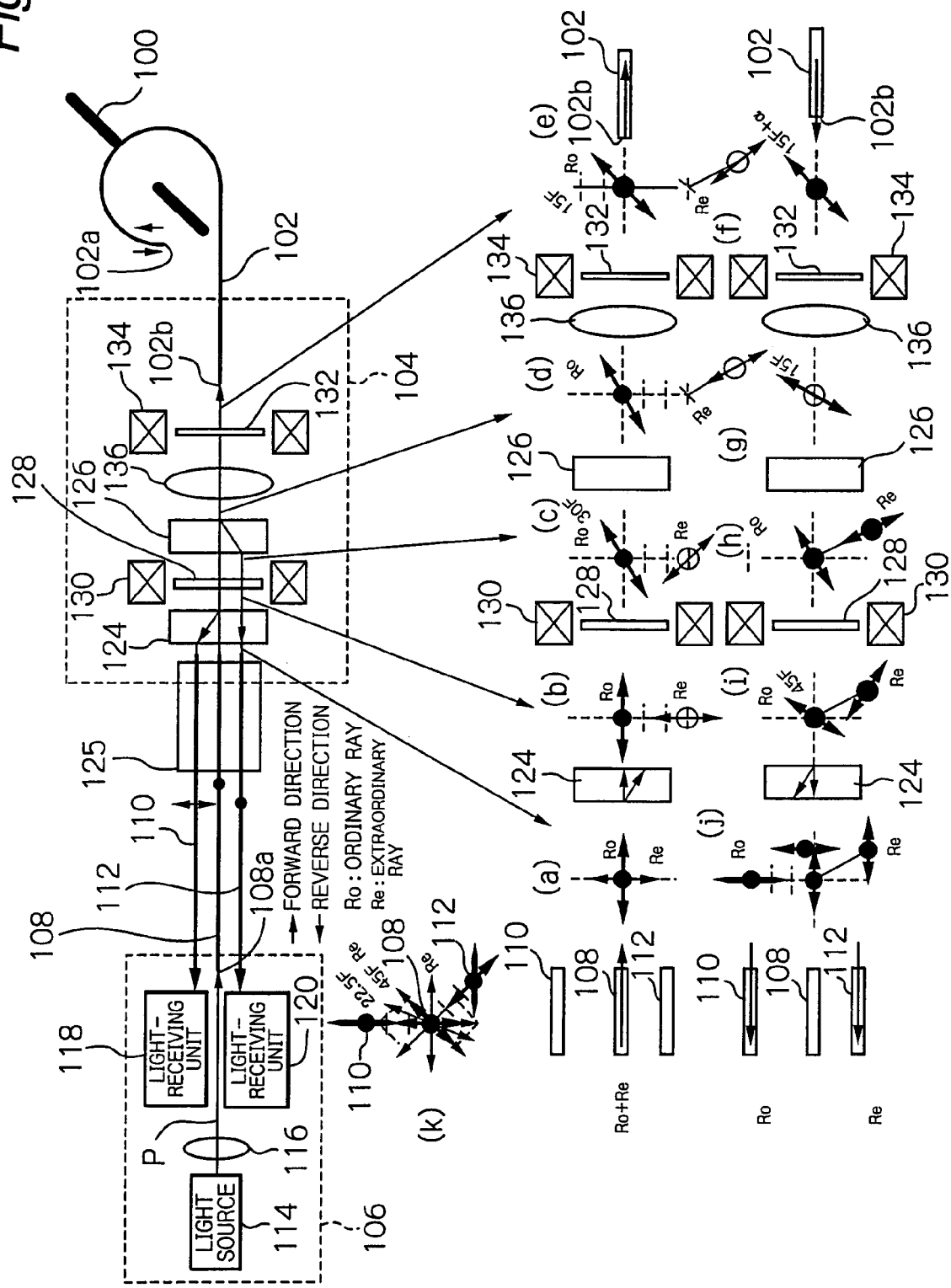
FIG. 7 is an explanatory view of an entire structure of a current measuring apparatus according to a sixth embodiment of the present invention.

FIG. 7 is a schematic view of an arrangement of a current measuring apparatus according to a sixth embodiment of the present invention, in which the angle of Faraday rotation in the 45°-rotation Faraday element shown in FIG. 5 is changed to 30°, and the angle of Faraday rotation in the 22.5°-rotation Faraday element shown in FIG. 5 is changed to 15°. In FIG. 7, the same portions as shown in FIG. 5 are designated by the same reference numerals as used in FIG. 5, and overlapping explanation is omitted.

A three-core ferrule 125 holds the three optical fibers 108, 110 and 112. With this arrangement, the polarization preserving optical fiber 108, the optical fiber 110 and the optical fiber 112 are held with a gap of a predetermined size being formed therebetween. FIG. 7(k) indicates a pattern of disposition of the polarization preserving optical fiber 108, the optical fiber 110 and the optical fiber 112 as the three-core ferrule 125 is viewed from the light source 114. As indicated in FIG. 6(k), the polarization preserving optical fiber 108 is positioned at the center by means of the three-core ferrule 125. The optical fiber 110 is positioned above the polarization preserving optical fiber 108, and the optical fiber 112 is positioned on the lower right side in FIG. 7(k).

In FIG. 7, the crystal axis of the second birefringent member 126 is inclined at 30° relative to the crystal axis of the first birefringent member 124, and the angle of Faraday rotation in the 45°-rotation Faraday element is 30°. In this case, a ferrule pattern other than that of FIG. 7 may also be employed.

The current measuring apparatus still functions even when the crystal axis of the second birefringent member 126 is inclined at 30° relative to the crystal axis of the first birefringent member 124. However, there are disadvantages such that the range of currents to be measured becomes narrow and light loss is generated (the light in the reverse direction is finally separated into four rays, so that an amount of light received by the light-receiving units decreases, thus increasing light loss of the entire system). Therefore, as indicated in the embodiments of FIGS. 5 and 6, it is preferable for the crystal axis of the second birefringent member to be inclined at 45° relative to the crystal axis of the first birefringent member.

The current measuring apparatuses of FIGS. 5 to 7 using reflection type optical fiber sensors are inexpensive and are capable of reducing light loss as compared to the current measuring apparatuses of FIGS. 1 to 4.

In the photoelectric converter 20 shown in FIG. 1, the 45°-rotation Faraday element 26, a magnet 26a, the birefringent member 23 and the light-receiving units 24 and 25 are provided. In the arrangement of FIG. 1, no lens is provided between the polarization preserving optical fiber 15 and the light-receiving unit 24. However, due to the 45°-rotation Faraday element 26 and the birefringent member 23, the distance between the polarization preserving optical fiber 15 and the light-receiving unit 24 cannot be reduced. Therefore, to enable all the light in the reverse direction emitted from the polarization preserving optical fiber 15 to be received by the light-receiving unit 24, the light-receiving unit 24 is required to have a large light-receiving area. Consequently, the light-receiving unit becomes expensive.

In the embodiment of FIG. 4, the light-receiving unit may have a small light-receiving area. Further, the C-portions, which are provided at two positions, can be standardized, thus achieving a reduction in cost as compared to conventional techniques. However, two alignment operations must be conducted for these C-portions. In an alignment operation, to conduct optimum light coupling between optical fibers through a lens, the positions of the components are finely shifted in X-, Y-, and Z-directions so as to determine an optimum coupling position, at which the components are finally fixed. The alignment operation is time-consuming, and requires expensive equipment, including a laser welding machine. Therefore, the cost of an alignment operation is high. If an alignment operation is required to be conducted only one time, the cost is reduced by half as compared to the aligning operation being conducted twice. Further, a throughput of the aligning equipment can be doubled. By reducing the number of C-portions from two to one, the number of lenses or two-core capillary tubings can be reduced.

In the above embodiments, an alignment operation should be conducted one time in the photocircuit. Therefore, it is possible to provide an inexpensive reflection type current sensor with a reduced number of components. Further, because the number of components is reduced, transmission loss of light is suppressed. Further, because the alignment operation is conducted only one time, the number of optical coupling points is reduced, thus reducing coupling loss.

Figure 8:
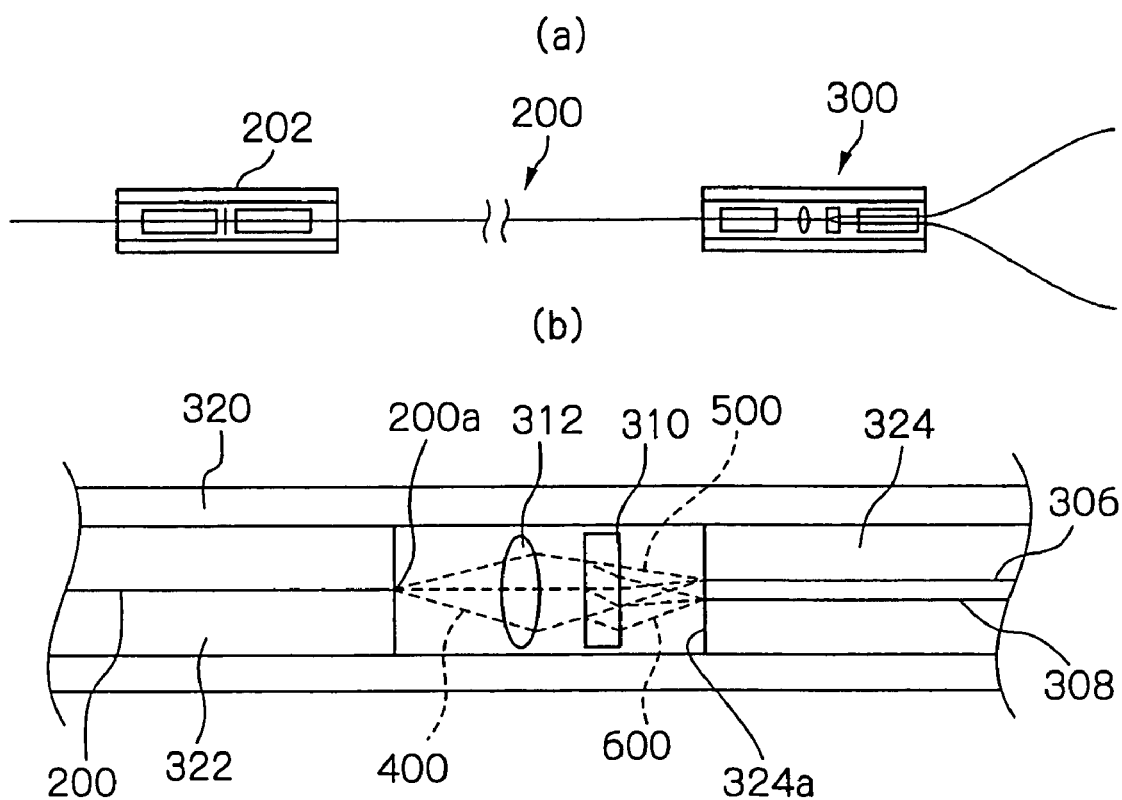
FIG. 8($a$) is an explanatory view of an entire structure of a current measuring apparatus according to a seventh embodiment of the present invention.
Figure 14:
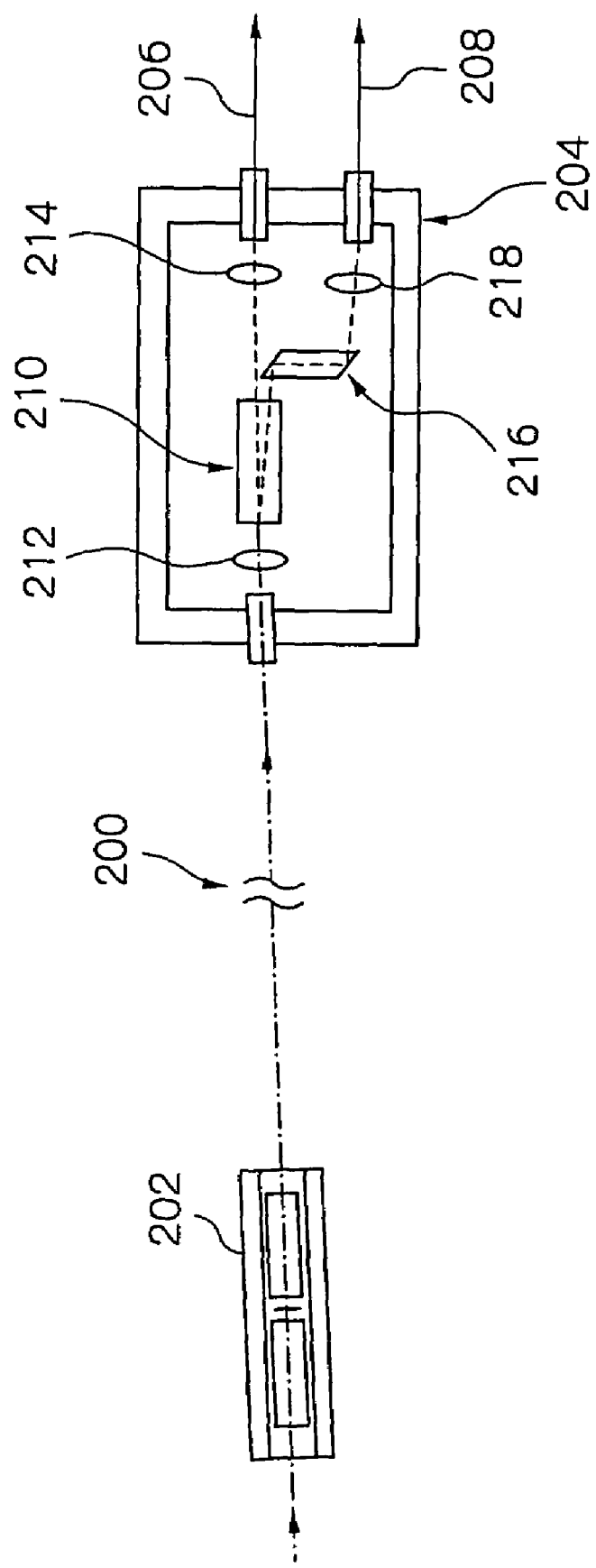
FIG. 14 is a schematic diagram of a conventional transmission type current measuring apparatus.

Next, referring to FIG. 8, description is made with regard to a current measuring apparatus according to a seventh embodiment of the present invention. In the above embodiments, current measuring apparatuses using reflection type optical fiber sensors are explained. In the current measuring apparatus in the seventh embodiment, a transmission type optical fiber sensor is used. The current measuring apparatus of the seventh embodiment is formed by improving the arrangements of the conventional current measuring apparatus of FIG. 14. The same arrangements as those shown in FIG. 14 are designated by the same reference numerals as used in FIG. 14.

In the transmission type current measuring apparatus shown in FIG. 8, an optical fiber sensor 200 is extended or looped around the conductor through which the current to be measured flows. One end of the optical fiber sensor 200 is connected to a thin type polarizer 202, and the other end of the optical fiber sensor 200 is connected to a photocircuit 300 as a polarized-beam splitter. The polarizer 202 receives random light from a light source (not shown), and outputs only linearly polarized light to the optical fiber sensor 200. The linearly polarized light, when passed through the optical fiber sensor 200, is subject to a magnetic field generated by the current to be measured, and a plane of polarization of the light is rotated due to the Faraday effect. The linearly polarized light with the rotated plane of polarization is emitted from the other end of the optical fiber sensor 200, and enters the photocircuit 300. In the photocircuit 300, a birefringent member 310 is provided such that its crystal axis is rotated by 45° relative to the plane of polarization of the light from the optical fiber sensor 200 in the absence of a magnetic field. With this arrangement, the light is split into an ordinary ray 500 and an extraordinary ray 600. The ordinary ray 500 is emitted into a first optical fiber 306 and the extraordinary ray 600 is emitted into a second optical fiber 308. The light which has passed through the first optical fiber 306 and the light which has passed through the second optical fiber 308 are outputted to a photoelectric converter (not shown). In the photoelectric converter, the light which has passed through the first optical fiber 306 and the light which has passed through the second optical fiber 308 are respectively converted into electrical values, which are then supplied to a signal processing circuit (not shown). Based on these electrical values, an angle of Faraday rotation is determined, and a magnitude of the current to be measured is finally determined.

The photocircuit 300 comprises the birefringent member 310 for splitting linearly polarized light 400 into the ordinary ray 500 and the extraordinary ray 600, and a lens 312 for guiding the linearly polarized light emitted from an output end 200a of the optical fiber sensor 200 to the birefringent member 310. The birefringent member 310 and the lens 312 are disposed in a cylindrical housing 320. A one-hole ferrule 322 is connected to one end portion of the cylindrical housing 320, and a two-core ferrule 324 is connected to the other end portion of the cylindrical housing 320. The output end of the optical fiber sensor 200 is fitted into the hole of the one-hole ferrule 322 and held therein. Input ends of the first optical fiber 206 and the second optical fiber 208 are respectively fitted into the holes of the two-core ferrule 324 and held therein. The two-core ferrule 324 is formed as a maintaining means to maintain the first and second optical fibers with a gap of a predetermined size being formed therebetween (corresponding to a distance between the two cores). The two-core ferrule 324 includes a sensor-side end face 324a for holding the input ends of the first and second optical fibers 306 and 308. The end face 324a is disposed in the vicinity of the birefringent member 310.

Thus, the first and second optical fibers are held with a gap of a predetermined size being formed therebetween by means of the two-core ferrule 324. Therefore, the input ends of the first and second optical fibers 306 and 308 can be provided in the vicinity of the birefringent member 310. Therefore, it is unnecessary to provide lenses between the input ends of the first and second optical fibers 306 and 308 and the birefringent member 310, and the separation distance between the ordinary ray 500 and the extraordinary ray 600 in the birefringent member 310 and the predetermined size of the gap in the two-core ferrule 324 can be easily matched.

The lens 312 is provided between the output end 200a of the fiber sensor and the lens 312. Focal points of the lens 312 are formed at the output end 200a of the optical fiber sensor and the input ends of the first and second optical fibers 306 and 308.

The transmission axis of the polarizer 202 and the crystal axis of the birefringent member 310 are displaced by 45° relative to each other. By this arrangement, the linearly polarized light emitted from the optical fiber sensor 200 can be split into the ordinary ray and the extraordinary ray which are orthogonal to each other.

Thus, in the transmission type optical fiber sensor in this embodiment, it is unnecessary to provide, between the birefringent member 310 and the optical fiber sensors 306 and 308, two lenses 214 and 218 and the optical path shift prism 216, which are required to be provided in the conventional transmission type current measuring apparatus. Therefore, the size of the photocircuit 300 can be reduced, and hence the entire structure of the current measuring apparatus can be reduced in size.

It should be noted that instead of the lens 312 shown in FIG. 8, a GRIN lens having an inconsistent refractive index may be employed.

Figure 9:
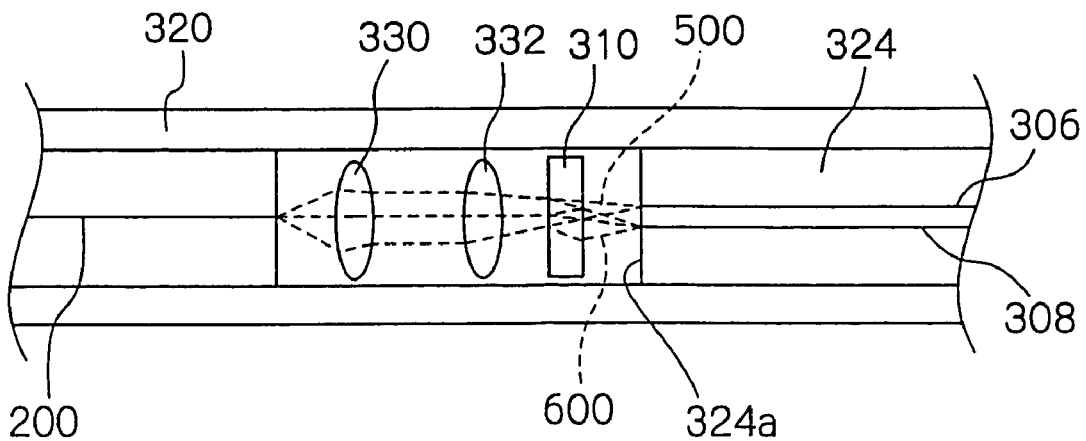
FIG. 9 is an enlarged view of an essential part of a current measuring apparatus according to an eighth embodiment of the present invention.
Figure 10:
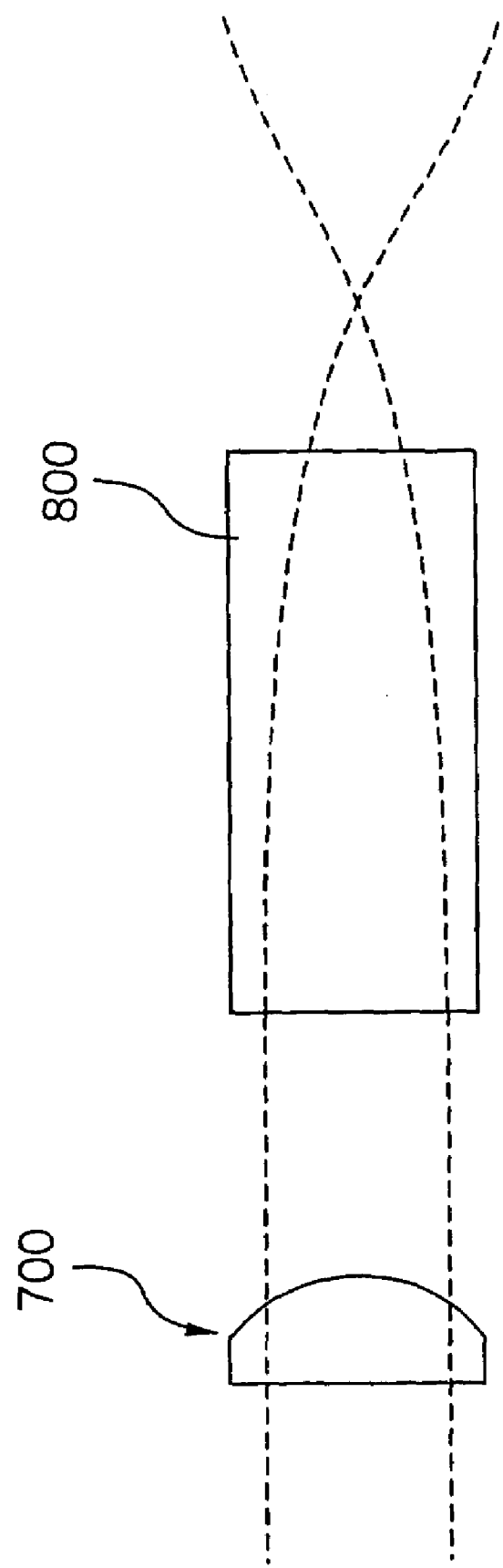
FIG. 10 is a schematic diagram for explaining an arrangement of a lens in an embodiment of the present invention.
Figure 11:
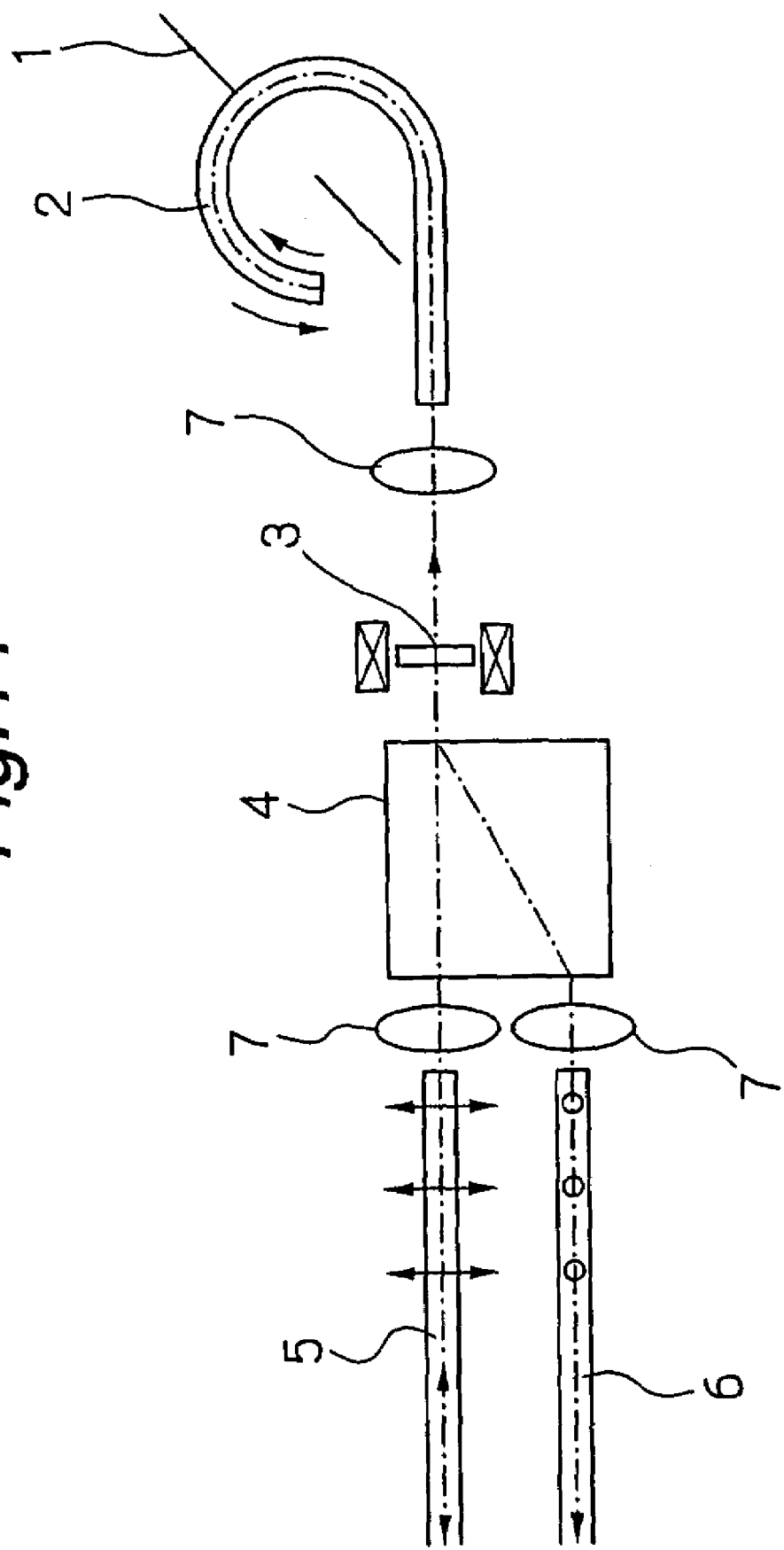
FIG. 11 is an explanatory view of an essential part of a conventional current measuring apparatus.
Figure 12:
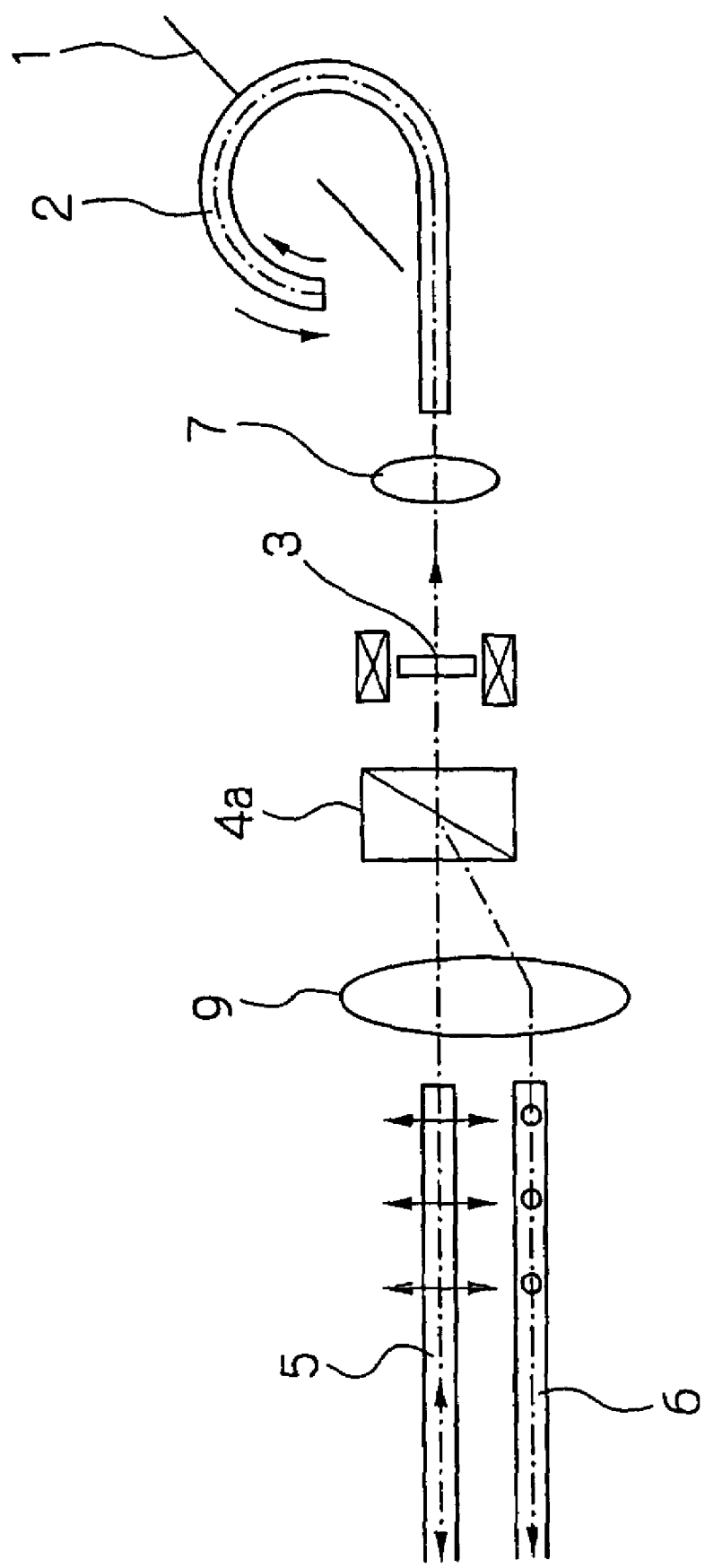
FIG. 12 is an explanatory view of an essential part of an improved arrangement of the current measuring apparatus shown in FIG. 11.
Figure 13:
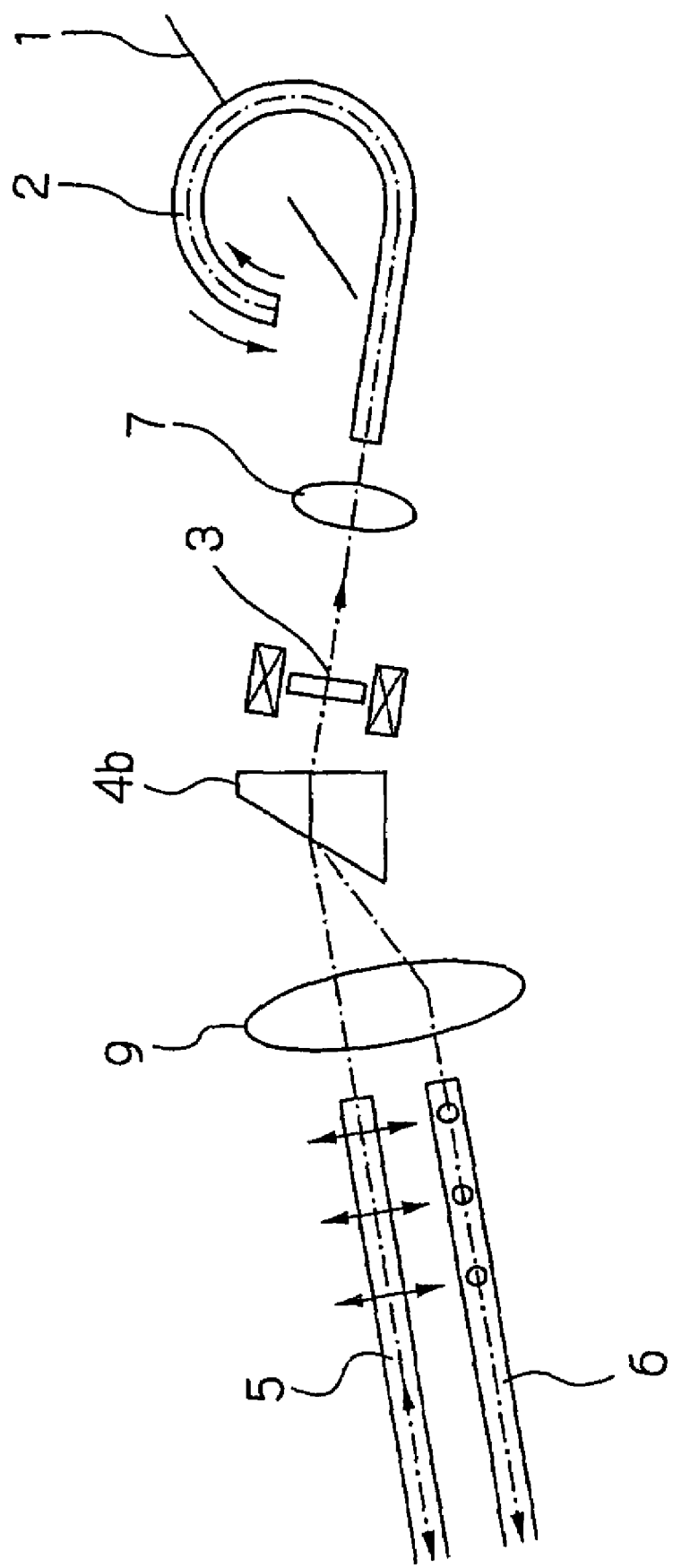
FIG. 13 is an explanatory view of an essential part of another improved arrangement of the current measuring apparatus shown in FIG. 11.

In the above embodiment, a single lens 312 is provided between the output end of the optical fiber sensor 200 and the birefringent member 310. However, as shown in FIG. 9, two lenses 330 and 332 may be arranged in tandem between the output end of the optical fiber sensor 200 and the birefringent member 310. In this case, it is preferred to use a collimate lens (a lens for forming parallel light rays) as the lens 330 while using a condensing lens as the lens 332. By this arrangement, the linearly polarized light is parallelized by means of the collimate lens 330 before it is focused through the condensing lens 332. Therefore, the linearly polarized light can be readily focused at the input ends of the first and second optical fibers 306 and 308. In FIG. 9, the same elements as shown in FIG. 8 are indicated by the same reference numerals as used in FIG. 8, and overlapping explanation is omitted.

INDUSTRIAL APPLICABILITY

As has been described in detail above, in the current measuring apparatus according to the present invention, the number of components can be reduced, thus achieving a reduction in size of the current measuring apparatus. Further, the current measuring apparatus can be easily assembled, thereby achieving a reduction in cost.

The invention claimed is:

1. A current measuring apparatus comprising:
   an optical fiber sensor extended or looped around a conductor through which a current to be measured flows,
   linearly polarized light emitted from a light source and propagated through said optical fiber sensor having a plane of polarization rotated under a magnetic field generated by the current to be measured;
   a photoelectric converter for converting into an electrical value an angle of rotation of the plane of polarization of the linearly polarized light after it exits said optical fiber sensor; and
   a photocircuit disposed between said optical fiber sensor and said photoelectric converter,
   said photocircuit including a birefringent member for separating the linearly polarized light into an ordinary ray and an extraordinary ray by birefringence and outputting the ordinary and extraordinary rays in parallel relation to each other,
   said current measuring apparatus further comprising:
   a plurality of optical fibers for transmitting the ordinary ray from the birefringent member of the photocircuit to said photoelectric converter, while transmitting the extraordinary ray from the birefringent member of the photocircuit to said photoelectric converter; and
   a maintaining means adapted to maintain said plurality of optical fibers with a gap of a predetermined size being formed therebetween,
   said plurality of optical fibers having ends and opposite ends said ends of the plurality of optical fibers being disposed in the vicinity of said birefringent member, and said opposite ends being connected to said photoelectric converter,
   said maintaining means comprises a gap maintaining member for maintaining said optical fibers parallel to each other with the gap of a predetermined size being formed there between,
   the ends of the plurality of optical fibers maintained in parallel by said gap maintaining member respectively receive the ordinary and extraordinary rays which are outputted in parallel from the birefringent member.

2. A current measuring apparatus according to claim 1, wherein a separation distance between the ordinary ray and the extraordinary ray in said birefringent member is matched to said predetermined size of the gap in the maintaining means.

3. A current measuring apparatus according to claim 1, wherein said photocircuit further comprises a lens system disposed between an end of said optical fiber sensor and said birefringent member, focal points of said lens system being formed at said end of the optical fiber sensor and said one end of the optical fibers.

4. A current measuring apparatus according to claim 1, wherein said gap maintaining member comprises a plural-core ferrule for maintaining said optical fibers parallel to each other with the gap of a predetermined size being formed there between.

5. A current measuring apparatus according to claim 4, wherein said optical fiber sensor has one end on which the linearly polarized light is incident and an opposite end by which the incident linearly polarized light is reflected, the reflected linearly polarized light being adapted to exit the optical-fiber sensor from said one end.

6. A current measuring apparatus according to claim 5, wherein said photoelectric circuit further comprises a Faraday element disposed between said one end of the optical fiber sensor and said birefringent member, said Faraday element being adapted to rotate the plane of polarization of the linearly polarized light through 22:5°.

7. A current measuring apparatus according to claim 6, wherein said plurality of optical fibers comprises: a first optical fiber for transmitting the light from said light source to said birefringent member and transmitting the ordinary ray returned from said birefringent member to said photoelectric converter; and
   a second optical fiber for transmitting the extraordinary ray returned from said birefringent member to said photoelectric converter.

8. A current measuring apparatus according to claim 7, wherein said lens system is disposed between said one end of the optical fiber sensor and said birefringent member, the focal points of said lens system being formed at an end-face core portion of said optical fiber sensor and an end-face core portion of said first optical fiber.

9. A current measuring apparatus according to claim 8, wherein said plural-core ferrule comprises a two-core ferrule for maintaining said first optical fiber and said second optical fiber parallel to each other with the gap of a predetermined size being formed therebetween.

10. A current measuring apparatus according to claim 6, wherein said photocircuit further comprises:
    a second birefringent member having the linearly polarized light from said optical fiber sensor directed thereto through said Faraday element and being adapted to separate the linearly polarized light into an ordinary ray and an extraordinary ray that are orthogonal to each other; and
    a second Faraday element for rotating respective planes of polarization of the ordinary ray and the extraordinary ray from said second birefringent member through 45°,
    said birefringent member being arranged such that the ordinary ray with the 45°-rotated plane of polarization is transmitted therethrough on a light axis, while the extraordinary ray with the 45°-rotated plane of polarization is refracted by birefringence so that the ordinary ray and the extraordinary ray exit said birefringent member with an increased separation distance,
    said birefringent member being arranged such that, out of the light emitted from the light source, linearly polarized light incident along a plane orthogonal to a plane containing a crystal axis of said birefringent—, tuber and the light axis is transmitted therethrough on the light axis, and outputted to said second Faraday element.

11. A current measuring apparatus according to claim 10, wherein said plurality of optical fibers comprises:
    a polarization preserving optical fiber for directing said random light from the light source to said birefringent member;
    a first optical fiber for transmitting the ordinary ray emerging from said birefringent member to said photoelectric converter; and
    a second optical fiber for transmitting the extraordinary ray emerging from said birefringent member to said photoelectric converter.

12. A current measuring apparatus according to claim 11, wherein
    said photocircuit further comprises a lens system disposed between said one end of the optical fiber sensor and said second birefringent member, focal points of said lens system being formed at an end-face core portion of said optical fiber sensor and an end-face core portion of said polarization preserving optical fiber.

13. A current measuring apparatus according to claim 12, wherein said plural-core ferrule comprises a three-core ferrule for maintaining said polarization preserving optical fiber, said first optical fiber and said second optical fiber parallel to each other with the gap of a predetermined size being formed therebetween.

14. A current measuring apparatus according to claim 5, wherein said optical fiber sensor is a reflection type sensor.

15. A current measuring apparatus according to claim 1, wherein said optical fiber sensor has one end on which the linearly polarized light is incident and an opposite end from which the incident linearly polarized light is outputted.

16. A current measuring apparatus according to claim 15, wherein said photocircuit further comprises a polarizer for transmitting only linearly polarized light out of random light emitted from the light source,
    said one end of the optical fiber sensor being disposed in the vicinity of said polarizer,
    said opposite end of the optical fiber sensor being disposed in contact with said birefringent member,
    a transmission axis of said polarizer and a crystal axis of said birefringent member being angularly displaced at 45° relative to each other, to thereby enable said birefringent member to separate the linearly polarized light emitted from said optical fiber sensor into the ordinary ray and the extraordinary ray that are orthogonal to each other.

17. A current measuring apparatus according to claim 16, wherein said plurality of optical fibers comprises:
    a first optical fiber for transmitting the ordinary ray emerging from said birefringent member to said photoelectric converter; and
    a second optical fiber for transmitting the extraordinary ray emerging from said birefringent member to said photoelectric converter.

18. A current measuring apparatus according to claim 17, wherein said lens system is disposed between said opposite end of the optical fiber sensor and said birefringent member, the focal points of said lens system being formed at an end-face core portion of said opposite end of the optical fiber sensor and an end-face core portion of said first optical fiber.

19. A current measuring apparatus according to claim 18, wherein said gap maintaining member comprises a two-core ferrule for maintaining said first optical fiber and said second optical fiber parallel to each other with the gap of a predetermined size being formed therebetween.

20. A current measuring apparatus according to claim 15, wherein said optical fiber sensor is a transmission type sensor.

21. A current measuring apparatus according to claim 1, wherein:
    said photoelectric converter comprises a first photoelectric converter element and a second photoelectric converter element; and
    said plurality of optical fibers comprises: a first optical fiber for transmitting the ordinary ray from the birefringent member to said first photoelectric converter element; and
    a second optical fiber for transmitting the extraordinary ray from the birefringent member to said second photoelectric converter element,
    an average value of an index of modulation being calculated with respect to each of two electrical signals obtained by said first and second photoelectric converter elements.

22. A current measuring apparatus comprising:

an optical fiber sensor extended or looped around a conductor through which a current to be measured flows, said optical fiber sensor being adapted to detect an angle of Faraday rotation, under a magnetic field of the current to be measured, of linearly polarized light emitted from a light source and propagated through said optical fiber sensor;

a photoelectric converter for converting the angle of Faraday rotation detected by said optical fiber sensor into an electrical value; and a photocircuit disposed between said optical fiber sensor and said photoelectric converter, said photocircuit including:

a Faraday element disposed in the vicinity of an input end of said optical fiber sensor and adapted to rotate a plane of polarization of the linearly polarized light through a predetermined angle; and a light-transmitting birefringent member disposed between said Faraday element and said photoelectric converter and adapted to separate the light emitted from said optical fiber sensor into an ordinary ray and an extraordinary ray that are orthogonal to each other, said current measuring apparatus further comprising:

a first optical fiber for directing the linearly polarized light to said birefringent member, while transmitting the ordinary ray emerging from the birefringent member to said photoelectric converter; and a second optical fiber for transmitting the extraordinary ray emerging from the birefringent member to said photoelectric converter, said photocircuit further including a lens system disposed between said input end of the optical fiber sensor and said birefringent member, focal points of said lens system being formed at an end-face core portion of said optical fiber sensor and an end-face core portion of said first optical fiber.

23. A current measuring apparatus according to claim 22, wherein said lens system is disposed between said birefringent member and said Faraday element.

24. A current measuring apparatus according to claim 22, wherein said birefringent member comprises a plane-parallel plate made of a material selected from the group consisting of rutile, yttrium orthovanadate, lithium niobate and calcite.

25. A current measuring apparatus according to claim 22, wherein:

said first and second optical fibers are maintained parallel to each other with a gap of a predetermined size being formed therebetween, by means of a gap maintaining member, such as a two-core ferrule; and said predetermined size of the gap between the first and second optical fibers is matched to a separation distance between the ordinary ray and the extraordinary ray, the separation distance being determined in relation to a thickness of, and a' material for said birefringent member formed by the plane-parallel plate.

26. A current measuring apparatus according to claim 22, wherein said predetermined angle is approximate to 22.5°.

* * * * *